US011309369B2

(12) United States Patent
Bae et al.

(10) Patent No.: US 11,309,369 B2
(45) Date of Patent: Apr. 19, 2022

(54) DISPLAY APPARATUS

(71) Applicant: Samsung Display Co., Ltd., Yongin-si (KR)

(72) Inventors: Injun Bae, Yongin-si (KR); Donghwi Kim, Yongin-si (KR); Chulho Kim, Yongin-si (KR); Woori Seo, Yongin-si (KR); Jin Jeon, Yongin-si (KR); Jinkoo Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 100 days.

(21) Appl. No.: 16/748,508

(22) Filed: Jan. 21, 2020

(65) Prior Publication Data

US 2020/0312926 A1     Oct. 1, 2020

(30) Foreign Application Priority Data

Mar. 28, 2019  (KR) .......................... 10-2019-0036199

(51) Int. Cl.
*H01L 27/32*      (2006.01)
*G09G 3/3266*    (2016.01)

(52) U.S. Cl.
CPC ....... *H01L 27/3234* (2013.01); *G09G 3/3266* (2013.01); *H01L 27/3262* (2013.01); *H01L 27/3276* (2013.01)

(58) Field of Classification Search
CPC ............ H01L 27/3234; H01L 27/3262; H01L 27/3276; G09G 3/3266
See application file for complete search history.

(56) References Cited

U.S. PATENT DOCUMENTS

| 10,191,577 | B2 | 1/2019 | Choi et al. |
| 2017/0287992 | A1 | 10/2017 | Kwak et al. |
| 2018/0107241 | A1 | 4/2018 | Evans, V et al. |
| 2018/0315357 | A1* | 11/2018 | Nam ................... H01L 27/3223 |
| 2020/0227494 | A1* | 7/2020 | Bae ..................... H01L 27/3248 |
| 2020/0295300 | A1* | 9/2020 | Chung ................. G06F 1/1626 |

FOREIGN PATENT DOCUMENTS

| KR | 10-2017-0096565 A | 8/2017 |
| KR | 10-2017-0111827 A | 10/2017 |
| KR | 10-2018-0049325 A | 5/2018 |

* cited by examiner

*Primary Examiner* — Feifei Yeung Lopez
(74) *Attorney, Agent, or Firm* — Lewis Roca Rothgerber Christie LLP

(57) ABSTRACT

Provided is a display apparatus including a substrate having a display area including a main pixel, and a sensor area including a sub-pixel and a transmission portion, a plurality of first lines arranged in the sensor area, extending in a first direction, and bypassing the transmission portion, and a first electrode layer under the plurality of first lines, between the sub-pixel and the transmission portion, and at least partially overlapping a spacing region between the plurality of first lines.

20 Claims, 14 Drawing Sheets

DISPLAY APPARATUS

CROSS-REFERENCE TO RELATED APPLICATION

This application claims priority to, and the benefit of, Korean Patent Application No. 10-2019-0036199, filed on Mar. 28, 2019, in the Korean Intellectual Property Office, the disclosure of which is incorporated herein in its entirety by reference.

BACKGROUND

1. Field

One or more embodiments disclosed herein relate to a display apparatus.

2. Description of the Related Art

Usage of display apparatuses is diversifying. In addition, the thickness and the weight of the display apparatuses are decreasing, and the range of use thereof is widening.

There are various methods of designing the shape of a display apparatus, as the display apparatus is utilized variously. Further, functions added to or associated with the display apparatus are increasing.

SUMMARY

One or more embodiments include a display apparatus having a sensor area in which a sensor or the like may be located in a display area. However, embodiments are not limited thereto.

Additional aspects will be set forth in part in the description that follows and, in part, will be apparent from the description, or may be learned by practice of the presented embodiments.

According to one or more embodiments, a display apparatus includes a substrate having a display area including a main pixel, and a sensor area including a sub-pixel and a transmission portion, a plurality of first lines arranged in the sensor area, extending in a first direction, and bypassing the transmission portion, and a first electrode layer under the plurality of first lines, between the sub-pixel and the transmission portion, and at least partially overlapping a spacing region between the plurality of first lines.

The plurality of first lines may include a scan line connected to the sub-pixel, and wherein the first electrode layer is connected to the scan line through a contact hole.

The display apparatus may further include a second electrode layer between the substrate and a sub-thin-film transistor of the sub-pixel, and corresponding to the sub-pixel.

The display apparatus may further include a driving voltage line extending in a second direction crossing the first direction, and configured to provide a driving voltage to the sub-pixel, wherein the second electrode layer is connected to the driving voltage line through a contact hole.

The first electrode layer and the second electrode layer may be spaced apart from each other and have an island shape.

The sub-pixel may include a sub-thin-film transistor including a semiconductor layer and a gate electrode, wherein some of the first lines are above a same layer as the gate electrode, and wherein the first electrode layer is under a layer in which the semiconductor layer is located.

The display apparatus may further include a third electrode layer overlapping at least one of a plurality of main thin-film transistors in the main pixel, wherein the third electrode layer is on a same layer as the first electrode layer.

The display apparatus may further include a second line extending in a second direction crossing the first direction, and overlapping the transmission portion overlaps.

The display apparatus may further include a second line extending in a second direction crossing the first direction, and arranged to bypass the transmission portion, and a second electrode layer under the second line so as to overlap the second line, and at a same layer as the first electrode layer.

A resolution of an image provided by the sensor area may be less than a resolution of an image provided by the display area.

According to one or more embodiments, a display apparatus includes a substrate having a display area including a main pixel, and a sensor area having a transmission portion and including a sub-pixel, a plurality of first lines arranged in the sensor area, extending in a first direction, and bypassing the transmission portion, a plurality of second lines arranged in the sensor area, and extending in a second direction crossing the first direction, and a first electrode layer under the plurality of first lines, and at least partially overlapping a spacing region between the plurality of first lines, wherein the first electrode layer is between the sub-pixel and the transmission portion.

The display apparatus may further include a component corresponding to the sensor area on a lower surface of the substrate.

Some of the plurality of second lines may cross the transmission portion.

The display apparatus may further include a second electrode layer on one side of the transmission portion, spaced apart from the first electrode layer, and at a same layer as the first electrode layer, wherein the plurality of second lines are arranged to bypass along an edge of the transmission portion, and wherein the second electrode layer overlaps the plurality of second lines.

The display apparatus may further include a pixel group surrounding the transmission portion, and including a plurality of sub-pixels, and a second electrode layer overlapping an entirety of the pixel group.

The first electrode layer may be connected to a scan line for transmitting a scan signal to the sub-pixels, wherein the second electrode layer is connected to a driving voltage line for transmitting a driving voltage to the sub-pixels.

The first electrode layer and the second electrode layer may be spaced apart from each other.

The display apparatus may further include a third electrode layer overlapping a main thin-film transistor, and at a same layer as the first electrode layer, wherein the main pixel includes a main thin-film transistor including a main semiconductor layer and a main gate electrode.

The third electrode layer may be connected to the main gate electrode.

The display apparatus may further include an opening area in the sensor area, a first component corresponding to the opening area on a lower surface of the substrate, and a second component corresponding to the sensor area on the lower surface of the substrate, wherein light transmittance of the opening area is greater than light transmittance of the sensor area, and wherein the sensor area includes a sub-pixel to implement an image.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
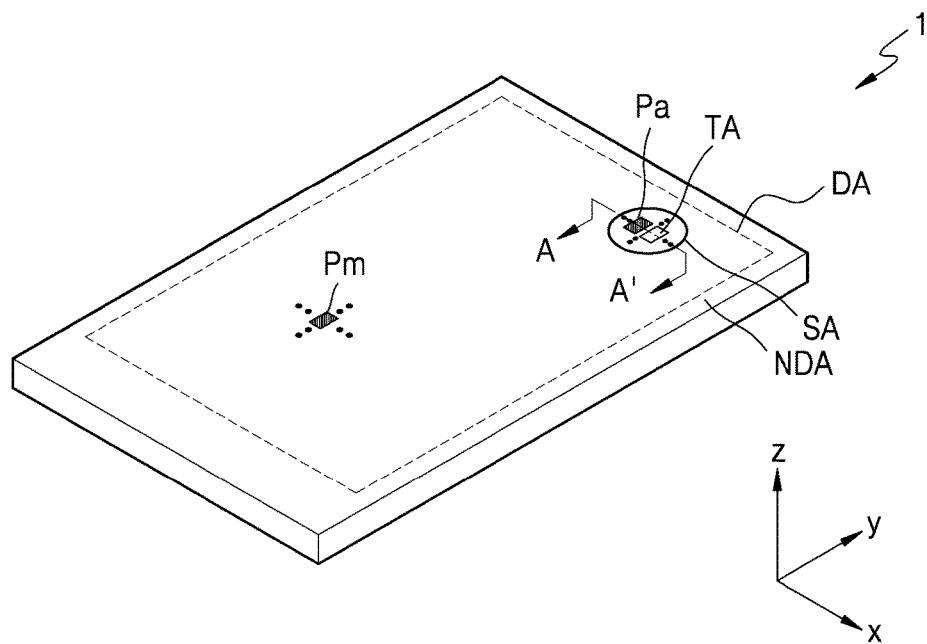
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Because the inventive concept may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

Hereinafter, embodiments of the disclosure will be described in detail with reference to the accompanying drawings. The same reference numerals are used to denote the same elements, and repeated descriptions thereof will be omitted.

It will be understood that although the terms "first", "second", etc. may be used herein to describe various components, these components should not be limited by these terms.

An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is connected to another portion, the layer, region, or component may be directly connected to the portion or an intervening layer, region, or component may exist. For example, when a layer, region, or component is electrically connected to another portion, the layer, region, or component may be directly electrically connected to the portion or may be indirectly connected to the portion through another layer, region, or component.

FIG. 1 is a perspective view of a display apparatus according to an embodiment;

Referring to FIG. 1, a display apparatus 1 includes a display area DA for implementing an image, and a non-display area NDA for not implementing an image. The display apparatus 1 may provide a main image by using light emitted from a plurality of main pixels Pm in the display area DA.

The display apparatus 1 includes a sensor area SA. The sensor area SA may be an area in which a component, such as a sensor using infrared rays, visible light, or sound, is below the sensor area SA, as described later below with reference to FIG. 2. The sensor area SA may include a transmission portion TA through which light and/or sound, which are either output to the outside from the component or traveling from the outside toward the component, can pass. In an embodiment, when infrared rays are transmitted through the sensor area SA, light transmittance may be about 10% or more, about 20% or more, about 25% or more, about 50% or more, about 85% or more, or about 90% or more.

In the present embodiment, a plurality of sub-pixels Pa may be arranged in the sensor area SA, and a certain image may be provided using light emitted from the plurality of sub-pixels Pa. The image provided by the sensor area SA may have a lower resolution than that of the image provided by the display area DA as a sub-image. That is, because the sensor area SA has the transmission portion TA through which light and/or sound may pass, the number of sub-pixels Pa that may be arranged per unit area may be less than the number of main pixels Pm arranged per unit area in the display area DA.

The sensor area SA may be at least partially surrounded by the display area DA. For example, FIG. 1 shows that the sensor area SA is entirely surrounded by the display area DA.

Hereinafter, an organic light-emitting display is described as an example of the display apparatus 1 according to an embodiment, although a display apparatus of the present disclosure is not limited thereto. In other embodiments, the display apparatus 1 may be various types of display apparatuses, such as an inorganic light-emitting (EL) display and a quantum dot EL display.

FIG. 1 shows that the sensor area SA is on one side (upper right side) of the rectangular display area DA, but the present disclosure is not limited thereto. A shape of the display area DA may be, for example, a circle, an ellipse, or a polygon, such as a triangle or a pentagon, and the position of the sensor area(s) SA and the number of sensor area(s) SA may vary.

Figure 2:
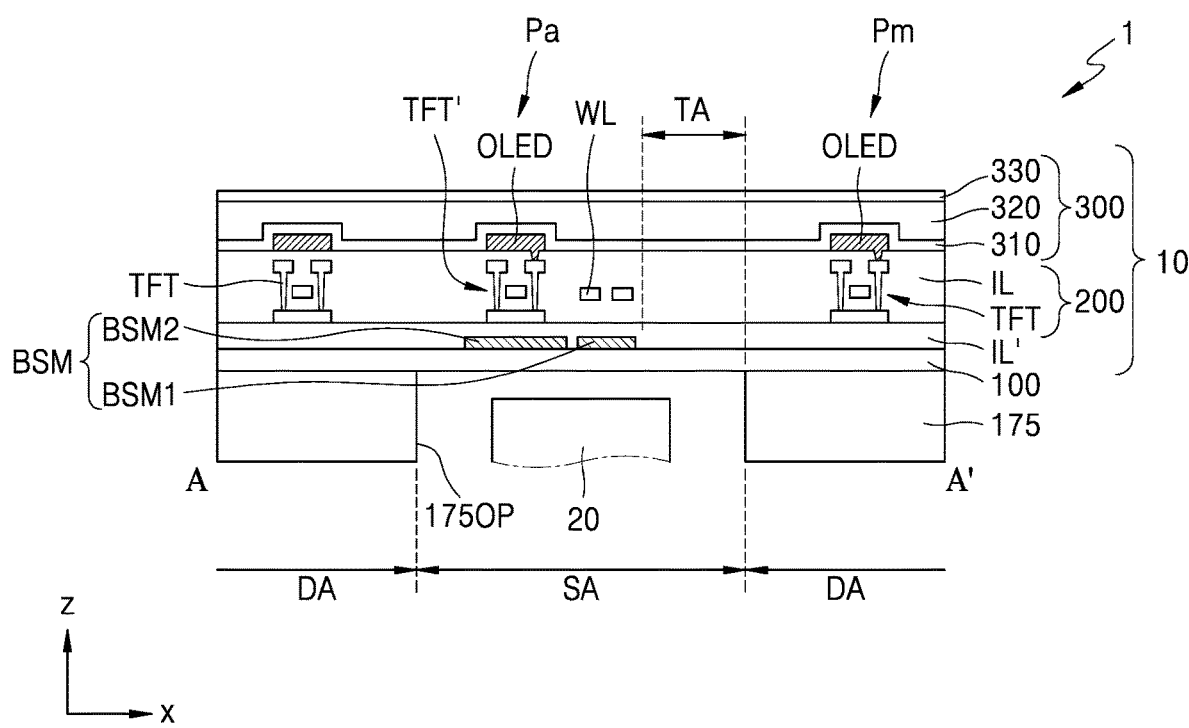
FIG. 2 is a cross-sectional view of a display apparatus according to one or more embodiments.

FIG. 2 is a cross-sectional view schematically showing a display apparatus according to one or more embodiments, and may correspond to a cross-section taken along the line A-A' in FIG. 1.

Referring to FIG. 2, the display apparatus 1 may include a display panel 10 including a display element and a component 20 corresponding to the sensor area SA.

The display panel 10 may include a substrate 100, a display element layer 200 on the substrate 100, and a thin film encapsulation layer 300 as a sealing member for sealing the display element layer 200. In addition, the display panel 10 may further include a lower protective film 175 below the substrate 100.

The substrate 100 may include glass or a polymer resin. For example, the polymer resin may include polyethersulfone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), and/or cellulose acetate propionate (CAP). The substrate 100 including the polymer resin may be flexible, rollable, or bendable. In some embodiments, the substrate 100 may have a multilayer structure including a layer including the above-described polymer resin and an inorganic layer.

The display element layer 200 may include a circuit layer including thin-film transistors TFT and TFT', an organic light-emitting diode OLED as a display element, and insulating layers IL and IL' therebetween.

A main pixel Pm including the main thin-film transistor TFT and an organic light-emitting diode OLED connected thereto may be in the display area DA, and the sub-thin-film transistor TFT' and a sub-pixel Pa including an organic light-emitting diode OLED connected thereto, and also including lines WL, may be arranged in the sensor area SA.

Further, the sensor area SA may be provided with the sub-thin-film transistor TFT', and with the transmission portion TA not including any display element. The transmission portion TA may be understood as an area through which light or a signal emitted from, or incident on, the component 20 is transmitted.

The component 20 may be in the sensor area SA. The component 20 may be an electronic element that uses light or sound. For example, the component 20 may include a sensor that receives light, such as an infrared sensor, a sensor that outputs and detects light and/or sound to measure distance or to recognize fingerprints, a small lamp that outputs light, a speaker that outputs sound, and the like. In the case of an electronic element using light, light in various wavelength bands, such as visible light, infrared light, and/or ultraviolet light, may be used. The number of components 20 arranged in the sensor area SA may be plural. For example, as the component 20, a light-emitting element and a light-receiving element may be provided together in one sensor area SA. Alternatively, a light-emitting unit and a light-receiving unit may be both provided as a single component 20.

In the present embodiment, a first electrode layer BSM1 and/or a second electrode layer BSM2 may be in the sensor area SA. The first electrode layer BSM1 may be located corresponding to (e.g., below) the plurality of lines WL in the sensor area SA, and the second electrode layer BSM2 may be located corresponding to (e.g. below) the sub-pixel Pa.

The first electrode layer BSM1 and the second electrode layer BSM2 may be arranged to correspond to a lower portion of the lines WL and a lower portion of the sub-thin-film transistor TFT'. The first electrode layer BSM1 and the second electrode layer BSM2 may reduce or prevent external light reaching the sub-pixel Pa, which includes the lines WL, and the sub-thin-film transistor TFT'. For example, light emitted from the component 20 that reaches the lines WL in the sub-pixel Pa may be reduced or prevented.

A constant voltage or a signal may be applied to the first and second electrode layers BSM1 and BSM2 to reduce or prevent damage to a pixel circuit due to electrostatic discharge. In some embodiments, the first electrode layer BSM1 and the second electrode layer BSM2 may respectively receive different voltages.

The thin film encapsulation layer 300 may include at least one inorganic encapsulation layer and at least one organic encapsulation layer. In this regard, FIG. 2 shows first and second inorganic encapsulation layers 310 and 330 and an organic encapsulation layer 320 therebetween.

The first and second inorganic encapsulation layers 310 and 330 may include one or more inorganic insulators, such as aluminum oxide, titanium oxide, tantalum oxide, hafnium oxide, zinc oxide, silicon oxide, silicon nitride, and/or silicon oxynitride. The organic encapsulation layer 320 may include a polymer-based material. Examples of the polymer-based material may include an acrylic resin, an epoxy resin, polyimide, and polyethylene.

The lower protective film 175 may be attached to a lower portion of the substrate 100 to support and protect the substrate 100. The lower protective film 175 may have an opening 1750P corresponding to the sensor area SA. Light transmittance of the sensor area SA may be improved by providing the opening 1750P in the lower protective film 175. The lower protective film 175 may be formed of PET and/or PI.

An area of the sensor area SA may be greater than an area where the component 20 is located. Accordingly, an area of the opening 1750P provided in the lower protective film 175 may not directly coincide with the area of the sensor area SA. For example, the area of the opening 1750P may be less than the area of the sensor area SA.

In other embodiments, on the display panel 10, components such as an input-sensing member for sensing a touch input, an antireflection member including a polarizer and a retarder or a color filter and a black matrix, and a transparent window may further be arranged.

Although the thin film encapsulation layer 300 is used as a sealing member for sealing the display element layer 200 in the present embodiment, the disclosure is not limited thereto. For example, as a member for sealing the display element layer 200, a sealing substrate, which is bonded to the substrate 100 by sealant or frit, may be used.

Figure 3:
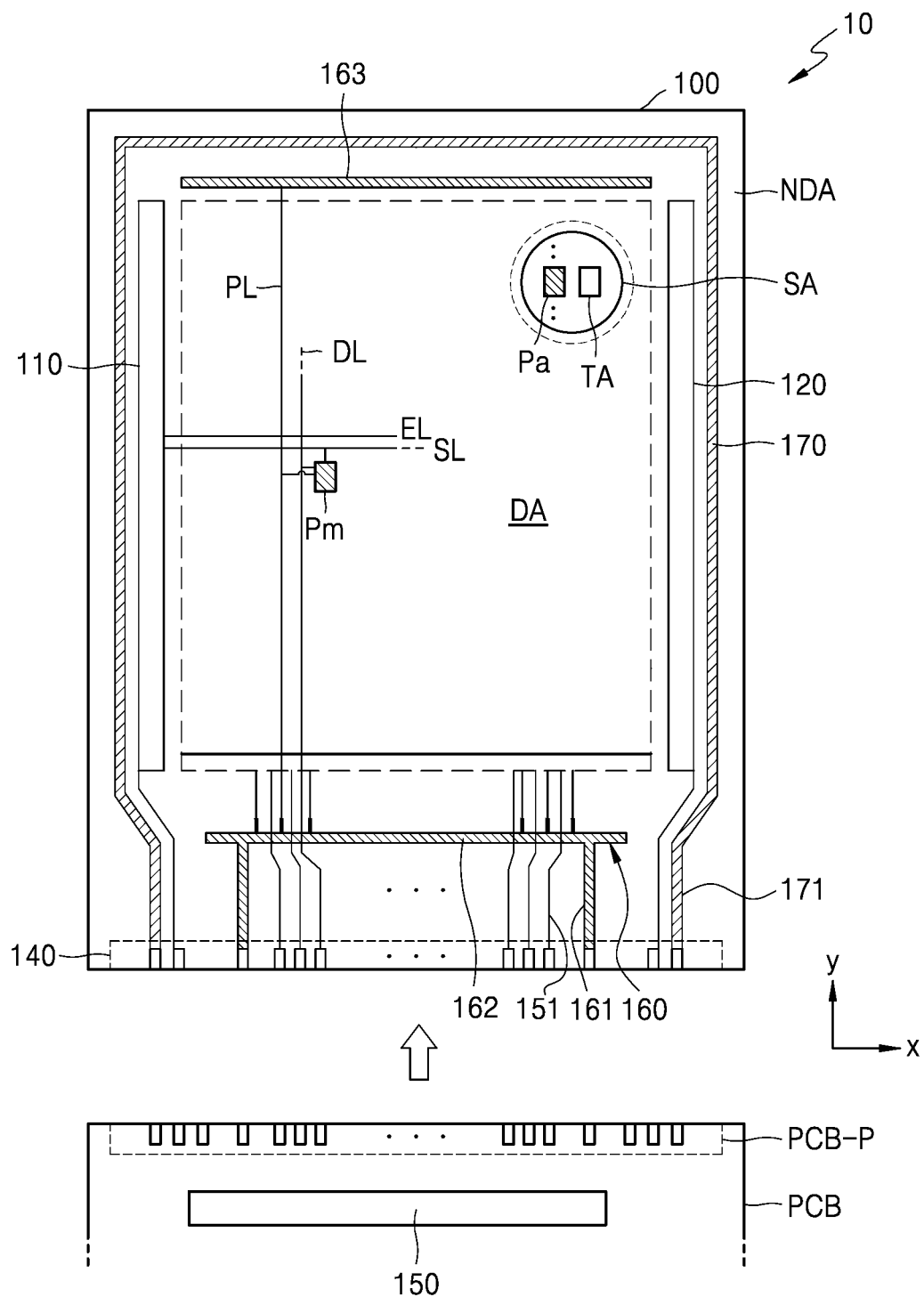
FIG. 3 is a plan view of a display apparatus according to an embodiment.

FIG. 3 is a plan view of the display panel 10 according to an embodiment.

Referring to FIG. 3, the display panel 10 includes the display area DA and includes the plurality of main pixels Pm. Each of the main pixels Pm may include a display element, such as an organic light-emitting diode. Each of the main pixels Pm may emit light such as, for example, red, green, blue, or white light, through the organic light-emitting diode. The main pixel Pm as described herein can be understood as a pixel that emits any one of red, green, blue, and white light, as described above. The display area DA may be covered with the sealing member described above with reference to FIG. 2 to be protected from external air or moisture.

The sensor area SA may be in the display area DA, and the plurality of sub-pixels Pa are arranged in the sensor area SA. Each of the sub-pixels Pa may include a display element, such as an organic light-emitting diode. Each of the sub-pixels Pa may emit light such as red, green, blue, or white light through the organic light-emitting diode. The sub-pixel Pa as described herein can be understood as a pixel that emits any one of red, green, blue, and white light, as described above. The sensor area SA may be provided with the transmission portion TA between the sub-pixels Pa.

In an embodiment, one main pixel Pm may include a pixel circuit that is identical to that of one sub-pixel Pa. However, the disclosure is not limited thereto. In other embodiments, the pixel circuit included in the main pixel Pm may be different from the pixel circuit included in the sub-pixel Pa.

Because the sensor area SA includes the transmission portion TA, a resolution in the sensor area SA may be less than that of the display area DA. For example, the resolution of the sensor area SA may be about ½ of the resolution of the display area DA. In some embodiments, the resolution of the display area DA may be about 400 ppi or more, and the resolution of the sensor area SA may be about 200 ppi.

Each of the main and sub-pixels Pm and Pa may be electrically connected to outer circuits arranged in the non-display area NDA. The non-display area NDA may include a first scan driving circuit 110, a second scan driving circuit 120, a terminal 140, a data driving circuit 150, a first power supply line 160, and a second power supply line 170.

The first scan driving circuit 110 may supply a scan signal to each of the main and sub-pixels Pm and Pa through a scan line SL. The first scan driving circuit 110 may provide a light emission control signal to each pixel through an emission control line EL. The second scan driving circuit 120 may be located in parallel with the first scan driving circuit 110 with the display area DA therebetween. Some of the main and sub-pixels Pm and Pa arranged in the display area DA may be electrically connected to the first scan driving circuit 110, and the remaining may be connected to the second scan driving circuit 120. In another embodiment, the second scan driving circuit 120 may be omitted.

The terminal 140 may be on one side of the substrate 100. The terminal 140 may be exposed by not being covered by the insulating layer, and may be electrically connected to a printed circuit board PCB. A terminal PCB-P of the printed circuit board PCB may be electrically connected to the terminal 140 of the display panel 10. In some embodiments, the printed circuit board PCB transmits a signal or power of a controller to the display panel 10. Control signals generated by the controller may be transmitted to the first and second scan driving circuits 110 and 120 through the printed circuit board PCB, respectively. The controller may provide first and second power supply voltages ELVDD and ELVSS (see FIGS. 4A and 4B to be described below) to the first and second power supply lines 160 and 170 through first and second connection lines 161 and 171, respectively. The first power supply voltage ELVDD may be provided to each of the main and sub-pixels Pm and Pa through a driving voltage line (e.g., a lower driving voltage line) PL connected to the first power supply line 160, and the second power supply voltage ELVSS may be provided to an opposite electrode of each of the main and sub-pixels Pm and Pa connected to the second power supply line 170.

The data driving circuit 150 is electrically connected to a data line DL. A data signal of the data driving circuit 150 may be provided to each of the main and sub-pixels Pm and Pa through a respective connection line 151 connected to the terminal 140 and the data line DL connected to the connection line 151. FIG. 3 shows that the data driving circuit 150 is located on the printed circuit board PCB. However, in another embodiment, the data driving circuit 150 may be on the substrate 100. For example, the data driving circuit 150 may be between the terminal 140 and the first power supply line 160.

The first power supply line 160 may include a first sub-line 162 and a second sub-line 163 extending in parallel (e.g., in an x direction shown in FIG. 3) with the display area DA therebetween. The second power supply line 170 may partly surround the display area DA in a loop shape with one side open.

Figure 4A:
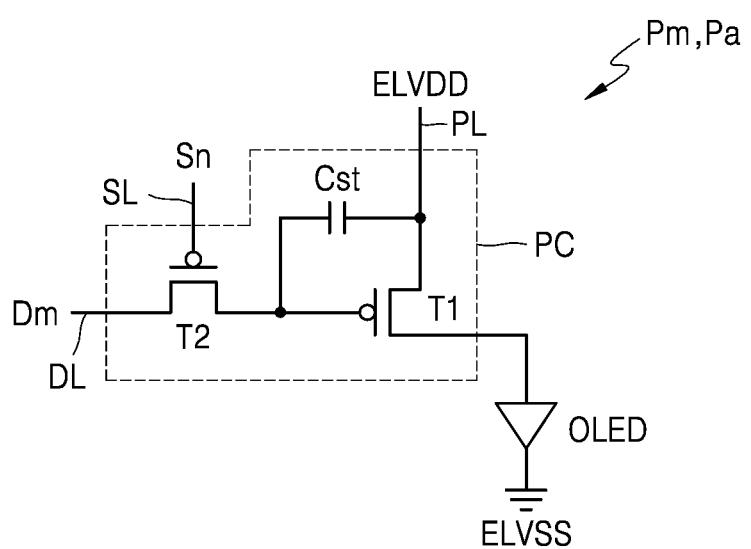
FIG. 4A is an equivalent circuit diagram of a pixel for performing active matrix driving which may be located in a display area of a display apparatus according to an embodiment.
Figure 4B:
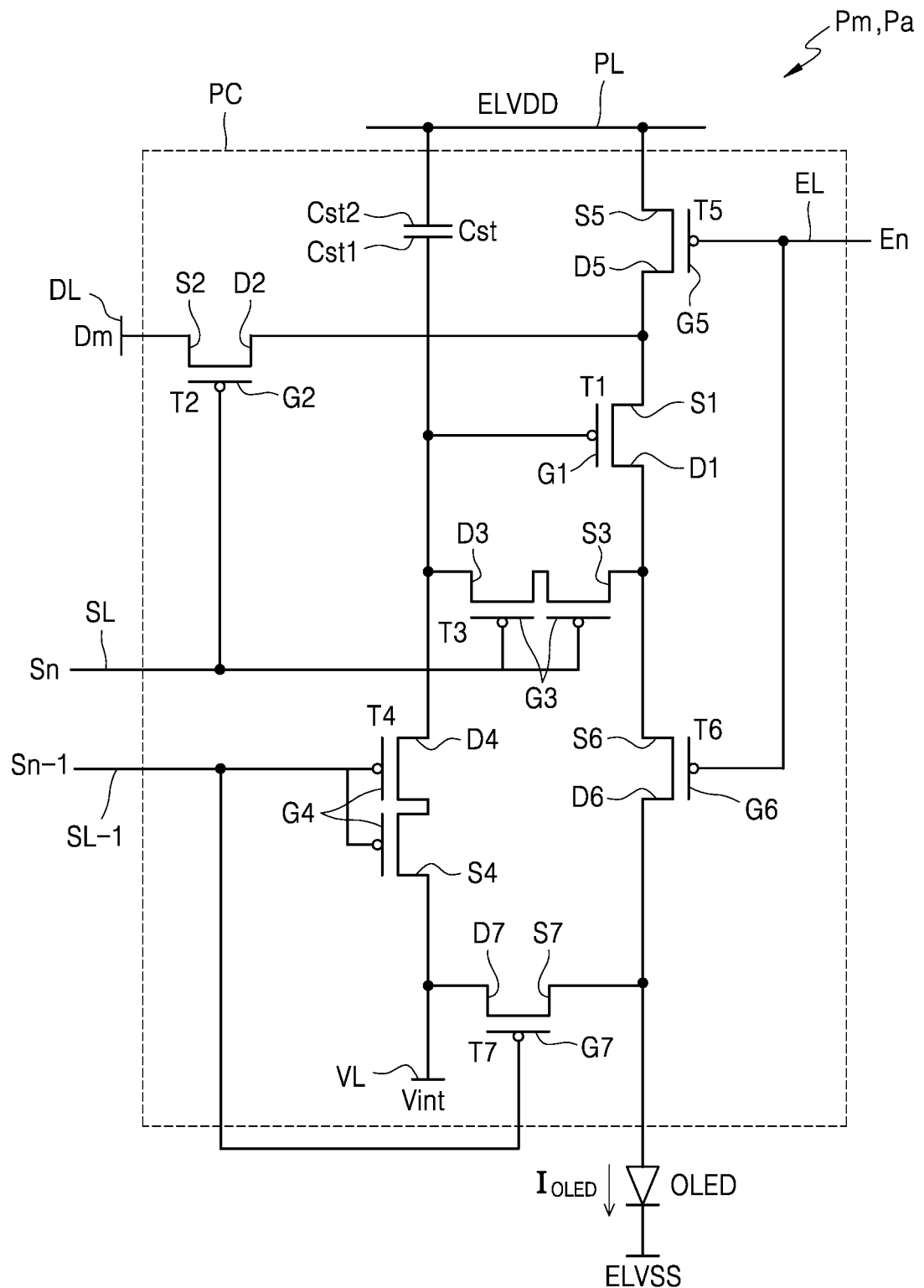
FIG. 4B is an equivalent circuit diagram of a pixel for performing active matrix driving which may be located in a display area of a display apparatus according to another embodiment.

FIGS. 4A and 4B are equivalent circuit diagrams of a main pixel and/or a sub-pixel that may be included in a display panel according to an embodiment.

Referring to FIG. 4A, each of the main and sub-pixels Pm and Pa includes a pixel circuit PC connected to the scan line SL and to the data line DL, and includes the organic light-emitting diode OLED connected to the pixel circuit PC.

The pixel circuit PC includes a driving thin-film transistor (TFT) T1, a switching TFT T2, and a storage capacitor Cst. The switching TFT T2 is connected to the scan line SL and the data line DL, and supplies to the driving TFT T1 a data signal Dm input through the data line DL according to a scan signal Sn.

The storage capacitor Cst is connected to the switching TFT T2 and the driving voltage line PL, and stores a voltage corresponding to a difference between a voltage supplied from the switching TFT T2 and the first power supply voltage ELVDD (or a driving voltage) supplied to the driving voltage line PL.

The driving TFT T1 is connected to the driving voltage line PL and the storage capacitor Cst, and may control a driving current flowing to the organic light-emitting diode OLED from the driving voltage line PL corresponding to a voltage value stored in the storage capacitor Cst. The organic light-emitting diode OLED may emit light (e.g., light having predetermined luminance) according to the driving current.

Although FIG. 4A describes a case where the pixel circuit PC includes two TFTs and one storage capacitor Cst, the disclosure is not limited thereto. For example, as shown in FIG. 4B, the pixel circuit PC may include seven thin-film transistors and one storage capacitor.

Referring to FIG. 4B, each of the main and sub-pixels Pm and Pa includes a pixel circuit PC, and an organic light-emitting diode OLED connected to the pixel circuit PC. The pixel circuit PC may include a plurality of thin-film transistors and a storage capacitor. The thin-film transistors and the storage capacitor may be connected to signal lines SL, SL−1, EL, and DL, an initialization voltage line VL, and the driving voltage line PL.

Although FIG. 4B shows that each of the main and sub-pixels Pm and Pa is connected to the signal lines SL, SL−1, EL, and DL, the initialization voltage line VL, and the driving voltage line PL, the present disclosure is not limited thereto. In another embodiment, at least one of the signal lines SLn, SLn−1, EL, and DL, the initialization voltage line VL, and the driving voltage line PL may be shared by neighboring pixels.

The plurality of thin-film transistors may include the driving TFT T1, the switching TFT T2, a compensation TFT T3, a first initialization TFT T4, an operation control TFT T5, an emission control TFT T6, and a second initialization TFT T7.

The signal lines include the scan line SL for transmitting the scan signal Sn, a previous scan line SL−1 for transmitting a previous scan signal Sn−1 to the first initialization TFT T4 and the second initialization TFT T7, an emission control line EL for transmitting the emission control signal En to the operation control TFT T5 and the emission control TFT T6, and a data line DL for transmitting the data signal Dm and crossing the scan line SL. The driving voltage line PL supplies first power supply voltage ELVDD to the driving TFT T1, and the initialization voltage line VL transmits an initialization voltage Vint for initializing the driving TFT T1 and a pixel electrode (e.g., an anode electrode of the OLED).

A driving gate electrode G1 of the driving TFT T1 is connected to a first storage capacitor plate Cst1 of the storage capacitor Cst, a driving source electrode S1 of the driving TFT T1 is connected to the driving voltage line PL through the operation control TFT T5, and a driving drain electrode D1 of the driving TFT T1 is electrically connected to a pixel electrode of the main organic light-emitting diode OLED through the emission control TFT T6. The driving TFT T1 receives the data signal Dm according to a switching operation of the switching TFT T2, and supplies a driving current IDLED to the main organic light-emitting diode OLED.

A switching gate electrode G2 of the switching TFT T2 is connected to the scan line SL, a switching source electrode S2 of the switching TFT T2 is connected to the data line DL, and a switching drain electrode D2 of the switching TFT T2 is connected to the driving source electrode S1 of the driving TFT T1 and is also connected to the driving voltage line PL through the operation control TFT T5. The switching TFT T2 is turned on in response to the scan signal Sn received through the scan line SL, and performs a switching operation for transmitting the data signal Dm, which is transmitted to the data line DL, to the driving source electrode S1 of the driving TFT T1.

A compensation gate electrode G3 of the compensation TFT T3 is connected to the scan line SL, a compensation source electrode S3 of the compensation TFT T3 is connected to the driving drain electrode D1 of the driving TFT T1, and is also connected to the pixel electrode of the organic light emitting diode OLED through the emission control TFT T6, and a compensation drain electrode D3 of the compensation TFT T3 is connected to the first storage capacitor plate Cst1 of the storage capacitor Cst, to a first initialization drain electrode D4 of the first initialization TFT T4, and to the driving gate electrode G1 of the driving TFT T1. The compensation thin-film transistor T3 is turned on in response to the scan signal Sn received through the scan line SL, and electrically connects the driving gate electrode G1 to the driving drain electrode D1 of the driving TFT T1 to thereby diode-connect the driving TFT T1.

A first initialization gate electrode G4 of the first initialization TFT T4 is connected to a previous scan line SL−1, a first initialization source electrode S4 of the first initialization TFT T4 is connected to a second initialization drain electrode D7 of the second initialization TFT T7 and to the initialization voltage line VL, and the first initialization drain electrode D4 of the first initialization TFT T4 is connected to the first storage capacitor plate Cst1 of the storage capacitor Cst, to the compensation drain electrode D3 of the compensation TFT T3, and to the driving gate electrode G1 of the driving TFT T1. The first initialization TFT T4 is turned on in response to a previous scan signal Sn−1 received through the previous scan line SL−1, and initializes a voltage of the gate electrode G1 of the driving TFT T1 by transmitting the initialization voltage Vint to the gate electrode G1 of the driving TFT T1.

An operation control gate electrode G5 of the operation control TFT T5 is connected to the emission control line EL, an operation control source electrode S5 of the operation control TFT T5 is connected to the driving voltage line PL, and an operation control drain electrode D5 of the operation control TFT T5 is connected to the driving source electrode S1 of the driving TFT T1 and to the switching drain electrode D2 of the switching TFT T2.

An emission control gate electrode G6 of the emission control TFT T6 is connected to the emission control line EL, an emission control source electrode S6 of the emission control TFT T6 is connected to the driving drain electrode D1 of the driving TFT T1 and to the compensation source electrode S3 of the compensation TFT T3, and an emission control drain electrode D6 of the emission control TFT T6 is electrically connected to a second initialization source electrode S7 of the second initialization TFT T7 and to the pixel electrode of the organic light-emitting diode OLED.

The operation control TFT T5 and the emission control TFT T6 are substantially simultaneously turned on in response to the emission control signal En received through the emission control line EL, so that the driving voltage ELVDD is transmitted to the main organic light-emitting diode OLED, and so that the driving current IDLED flows through the main organic light-emitting diode OLED.

A second initialization gate electrode G7 of the second initialization TFT T7 is connected to the previous scan line SL−1, the second initialization source electrode S7 of the second initialization TFT T7 is connected to the emission control drain electrode D6 of the emission control TFT T6 and to the pixel electrode of the main organic light-emitting diode OLED, and the second initialization drain electrode D7 of the second initialization TFT T7 is connected to the first initialization source electrode S4 of the first initialization TFT T4 and to the initialization voltage line VL. The second initialization TFT T7 is turned on in response to the previous scan signal Sn−1 received through the previous scan line SLn−1 to initialize the pixel electrode of the main organic light-emitting diode OLED.

Although FIG. 4B describes a case where the first initialization TFT T4 and the second initialization TFT T7 are connected to the previous scan line SL−1, the disclosure is not limited thereto. In another embodiment, the first initialization TFT T4 may be connected to the previous scan line SLn−1 and driven according to the previous scan signal Sn−1, and the second initialization TFT T7 may be connected to a separate signal line (e.g., a next scan line SL+1) and may be driven according to a signal transmitted to the signal line.

A second storage capacitor plate Cst2 of the storage capacitor Cst is connected to the driving voltage line PL, and an opposite electrode of the organic light-emitting diode OLED is connected to the second power supply voltage ELVSS. Accordingly, the organic light-emitting diode OLED may receive the driving current IDLED from the driving TFT T1, and may emit light to display an image.

FIG. 4B shows that the compensation TFT T3 and the first initialization TFT T4 have a dual gate electrode. However, the compensation TFT T3 and the first initialization TFT T4 may have one gate electrode in other embodiments.

In the present embodiment, the main pixel Pm and the sub-pixel Pa may have an identical pixel circuit PC. However, the disclosure is not limited thereto. The main pixel Pm and the sub-pixel Pa may have respective pixel circuits PC having different structures. For example, the main pixel Pm may employ the pixel circuit of FIG. 4B, and the sub-pixel Pa may employ the pixel circuit of FIG. 4A, and various modifications are possible.

Figure 5:
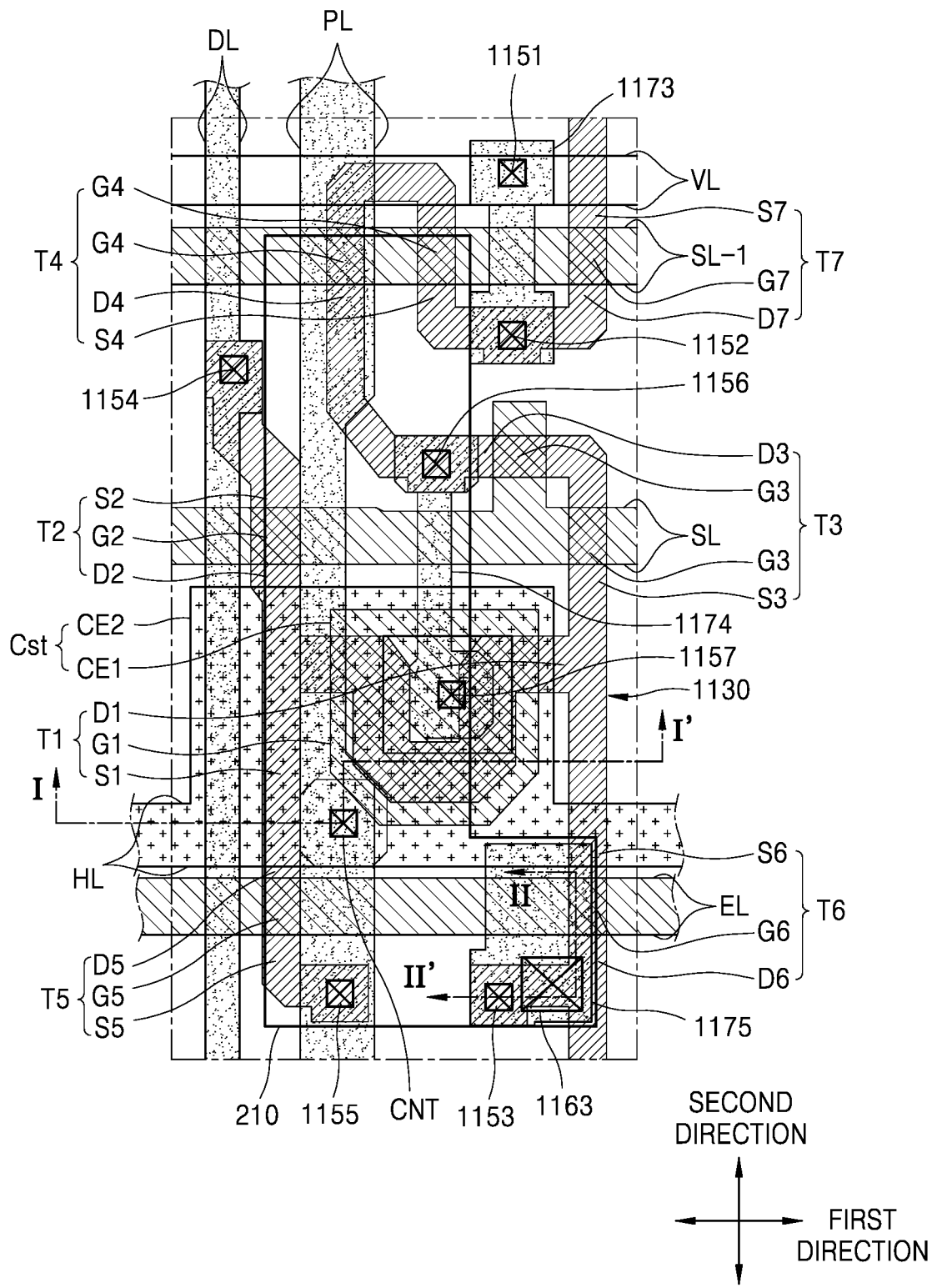
FIG. 5 is a plan view of a pixel circuit of a pixel of a display panel according to an embodiment.
Figure 6:
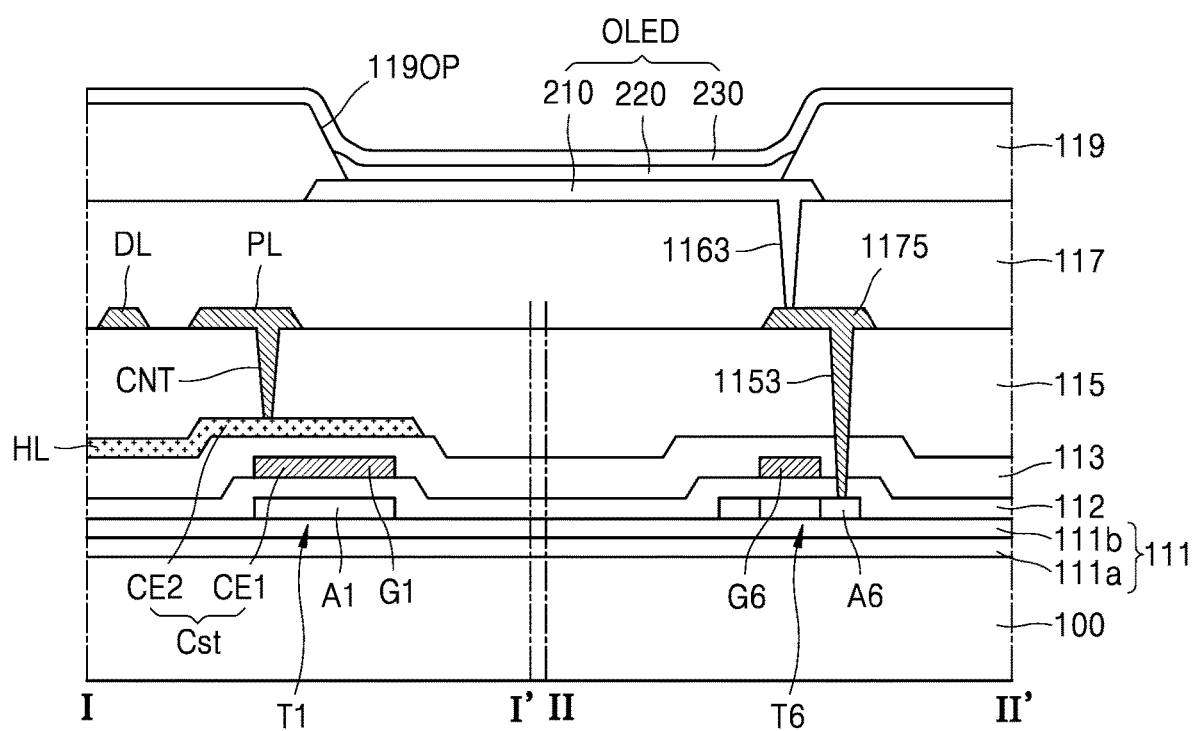
FIG. 6 is a cross-sectional view of organic light-emitting diodes arranged in a sectional view taken along the lines I-I' and II-II' of FIG. 5.

FIG. 5 is a layout diagram of pixel circuits of the pixels Pm and Pa of a display panel according to an embodiment, and FIG. 6 is a cross-sectional view of organic light-emitting diodes arranged in a sectional view taken along the lines I-I' and II-II' of FIG. 5.

Referring to FIG. 5, the driving TFT T1, the switching TFT T2, the compensation TFT T3, the first initialization TFT T4, the operation control TFT T5, the emission control TFT T6, and the second initialization TFT T7 are arranged along a semiconductor layer 1130. The semiconductor layer 1130 is on a substrate on which a buffer layer is formed, the buffer layer including an inorganic insulating material.

Some regions of the semiconductor layer 1130 may correspond to semiconductor layers of the driving TFT T1, the switching TFT T2, the compensation TFT T3, the first initialization TFT T4, the operation control TFT T5, the emission control TFT T6, and/or the second initialization TFT T7. In other words, it can be understood that the semiconductor layers of the driving TFT T1, the switching TFT T2, the compensation TFT T3, the first initialization TFT T4, the operation control TFT T5, the emission control TFT T6, and/or the second initialization TFT T7 are connected to each other and bent in various shapes.

The semiconductor layer 1130 includes a channel region, and a source region and a drain region on respective sides of the channel region, wherein the source region and the drain region can be understood as a source electrode and a drain electrode of a corresponding thin-film transistor. Hereinafter, for the sake of convenience, a source region and a drain region are referred to as a source electrode and a drain electrode, respectively.

The driving TFT T1 includes the driving gate electrode G1 overlapping a driving channel region, and the driving source electrode S1 and the driving drain electrode D1 on respective sides of the driving channel region. The driving channel region overlapped with the driving gate electrode G1 has a bent shape, such as an omega shape, so that a long channel length may be formed in a narrow space. When the driving channel region is long, a driving range of a gate voltage is widened, so that the gradation of light emitted from the organic light-emitting diode OLED may be more precisely controlled, and so that display quality may be improved.

The switching TFT T2 includes the switching gate electrode G2 overlapping a switching channel region, and the switching source electrode S2 and the switching drain electrode D2 on respective sides of the switching channel region. The switching drain electrode D2 may be connected to the driving source electrode S1.

The compensation TFT T3 may be a dual thin-film transistor having compensation gate electrodes G3 overlapping two compensation channel regions, and may include the compensation source electrode S3 and the compensation drain electrode D3 on respective sides of the two compensation channel regions. The compensation TFT T3 may be connected to the driving gate electrode G1 of the driving TFT T1 through a node connecting line 1174 to be described below.

The first initialization TFT T4 may be a dual thin-film transistor having first initialization gate electrodes G4 overlapping two first initialization channel regions, and may include the first initialization source electrode S4 and the first initialization drain electrode D4 on respective sides of the first initialization source electrode S4.

The operation control TFT T5 may include the operation control gate electrode G5 overlapping an operation control channel region, and may include the operation control source electrode S5 and the operation control drain electrode D5 on respective sides of the operation control gate electrode G5. The operation control drain electrode D5 may be connected to the driving source electrode S1.

The emission control TFT T6 may include the emission control gate electrode G6 overlapping an emission control channel region, and may include the emission control source electrode S6 and the emission control drain electrode D6 on respective sides of the emission control gate electrode G6. The emission control source electrode S6 may be connected to the driving drain electrode D1.

The second initialization TFT T7 may include the second initialization gate electrode G7 overlapping a second initialization channel region, and the second initialization source electrode S7 and the second initialization drain electrode D7 on respective sides of the second initialization gate electrode G7.

The aforementioned thin-film transistors may be connected to the signal lines SL, SL−1, EL, and DL, the initialization voltage line VL, and the driving voltage line PL.

The scan line SL, the previous scan line SL−1, the emission control line EL, and the driving gate electrode G1 may be arranged above the aforementioned semiconductor layer 1130 with an insulating layer(s) therebetween.

The scan line SL may extend in a first direction. Some regions of the scan line SL may correspond to the switching and compensation gate electrodes G2 and G3. For example, some regions of the scan line SL that overlap channel regions of the switching and compensation TFTs T2 and T3 may be the switching and compensation gate electrodes G2 and G3, The previous scan line SL−1 may extend in the first direction, and some regions of the previous scan line SL−1 may correspond to the first and second initialization gate electrodes G4 and G7, respectively. For example, some regions of the previous scan line SL−1 overlapping the channel regions of the first and second initialization driving TFTs T4 and T7 may be the first and second initialization gate electrodes G4 and G7, respectively.

The emission control line EL extends in the first direction. Some regions of the emission control line EL may correspond to the operation control and emission control gate electrodes G5 and G6, respectively. For example, some regions of the emission control line EL overlapping channel regions of the operation control and emission control TFTs T5 and T6 may be the operation control and emission control gate electrodes G5 and G6, respectively.

The driving gate electrode G1 is a floating electrode, and may be connected to the compensation TFT T3 through the aforementioned node connecting line 1174.

An electrode voltage line HL may be on the scan line SL, the previous scan line SL−1, the emission control line EL, and the driving gate electrode G1 with an insulating layer(s) therebetween.

The electrode voltage line HL may extend in the first direction so as to cross the data line DL and the driving voltage line PL. A portion of the electrode voltage line HL covers at least a portion of the driving gate electrode G1, and may form the storage capacitor Cst together with the driving gate electrode G1. For example, the driving gate electrode G1 may be a first storage capacitor plate CE1 (e.g., Cst1 in FIG. 4B) of the storage capacitor Cst, and a portion of the electrode voltage line HL may be a second storage capacitor plate CE2 (e.g., Cst2 in FIG. 4B) of the storage capacitor Cst.

The second storage capacitor plate CE2 of the storage capacitor Cst is electrically connected to the driving voltage line PL. In this regard, the electrode voltage line HL may be connected to the driving voltage line PL on the electrode voltage line HL through a contact hole CNT. Therefore, the electrode voltage line HL may have the same voltage level (constant voltage) as that of the driving voltage line PL. For example, the electrode voltage line HL may have a constant voltage of about +5V. The electrode voltage line HL can be understood as a horizontal driving voltage line.

Because the driving voltage line PL extends in a second direction, and because the electrode voltage line HL, which is electrically connected to the driving voltage line PL, extends in the first direction crossing the second direction, a plurality of driving voltage lines PL and electrode voltage lines HL may form a mesh structure in a display area.

The data line DL, the driving voltage line PL, an initialization connecting line 1173, and the node connecting line 1174 may be on the electrode voltage line HL with an insulating layer(s) therebetween.

The data line DL extends in the second direction, and may be connected to the switching source electrode S2 of the switching TFT T2 through a contact hole 1154. A portion of the data line DL can be understood as a switching source electrode.

The driving voltage line PL extends in the second direction and is connected to the electrode voltage line HL through the contact hole CNT, as described above. Further, the driving voltage line PL may be connected to the operation control TFT T5 through a contact hole 1155. The driving voltage line PL may be connected to the operation control drain electrode D5 through the contact hole 1155.

One end of the initialization connecting line 1173 may be connected to the first and second initialization TFTs T4 and T7 through a contact hole 1152, and the other end of the initialization connecting line 1173 may be connected to the initialization voltage line VL to be described below through a contact hole 1151.

One end of the node connecting line 1174 may be connected to the compensation drain electrode D3 through a contact hole 1156, and the other end of the node connecting line 1174 may be connected to the driving gate electrode G1 through a contact hole 1157.

The initialization voltage line VL may be on the data line DL, the driving voltage line PL, the initialization connecting line 1173, and the node connecting line 1174 with an insulating layer(s) therebetween.

The initialization voltage line VL extends in the first direction. The initialization voltage line VL may be connected to the first and second initialization driving TFTs T4 and T7 through the initialization connecting line 1173. The initialization voltage line VL may have a constant voltage (e.g., about −2 V, etc.).

The initialization voltage line VL is on the same layer as a pixel electrode 210 of the organic light-emitting diode OLED (see FIG. 6), and may include the same material as that of the pixel electrode 210. The pixel electrode 210 may be connected to the emission control TFT T6. The pixel electrode 210 may be connected to a connecting metal 1175 through a contact hole 1163, and the connecting metal 1175 may be connected to the emission control drain electrode D6 through a contact hole 1153.

Although FIG. 5 shows that the initialization voltage line VL is on the same layer as the pixel electrode 210, in another embodiment, the initialization voltage line VL may be on the same layer as the electrode voltage line HL.

Hereinafter, with reference to FIG. 6, a stacked structure of components included in a display panel according to an embodiment will be described.

The substrate 100 may include glass or a polymer resin. For example, the polymer resin may include PES, PAR, PEI, PEN, PET, PPS, PAR, PI, PC, or CAP. The substrate 100 including the polymer resin may be flexible, rollable, or bendable. In other embodiments, the substrate 100 may have a multilayer structure including a layer including the above-described polymer resin and an inorganic layer.

A buffer layer 111 is on the substrate 100 to reduce or block the penetration of foreign materials, moisture, or external air from a lower side of the substrate 100, and may provide a flat surface on the substrate 100. The buffer layer 111 may include an inorganic material, such as an oxide or nitride, an organic material, or an organic-inorganic composite material, and may have a single layer structure or a multilayer structure including an inorganic material or an organic material. In other embodiments, a barrier layer may be further interposed between the substrate 100 and the buffer layer 111 to block penetration of external air. The buffer layer 111 may include a first buffer layer 111a and a second buffer layer 111b that are stacked.

The gate electrodes G1 and G6 are on semiconductor layers A1 and A6 with a first gate insulating layer 112 therebetween. Each of the gate electrodes G1 and G6 includes molybdenum (Mo), aluminum (Al), copper (Cu), or titanium (Ti), and may be formed as a single layer or as multiple layers. For example, each of the gate electrodes G1 and G6 may be a single layer of Mo. The scan line SL, the previous scan line SL−1, and the emission control line EL may be formed on the same layer as the gate electrodes G1 and G6. That is, the gate electrodes G1 and G6, the scan line SL, the previous scan line SL−1, and the emission control line EL may be on a first gate insulating layer 112.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A second gate insulating layer 113 may be provided to cover the gate electrodes G1 and G6. The second gate insulating layer 113 may include $SiO_2$, $SiN_x$, SiON, $Al_2O_3$, $TiO_2$, $Ta_2O_5$, $HfO_2$, or $ZnO_2$.

The first storage capacitor plate CE1 of the storage capacitor Cst may be integrally formed with the gate electrode G1 of the driving TFT T1. For example, the gate electrode G1 of the driving TFT T1 may serve as the first storage capacitor plate CE1 of the storage capacitor Cst.

The second storage capacitor plate CE2 of the storage capacitor Cst overlaps the first storage capacitor plate CE1 with the second gate insulating layer 113 therebetween. Here, the second gate insulating layer 113 may serve as a dielectric layer of the storage capacitor Cst. The second storage capacitor plate CE2 may include a conductive material including Mo, Al, Cu, or Ti, and may be formed as a single layer or as multiple layers including one or more of the above materials. For example, the storage capacitor plate CE2 may be a single layer of Mo, or may be multiple layers of Mo/Al/Mo.

In the drawings, the storage capacitor Cst overlaps the driving TFT T1, but the disclosure is not limited thereto. The storage capacitor Cst may not overlap the driving TFT T1, and various modifications are possible.

The second storage capacitor plate CE2 may serve as the electrode voltage line HL. For example, a portion of the electrode voltage line HL may be the second storage capacitor plate CE2 of the storage capacitor Cst.

An interlayer insulating layer 115 may be provided to cover the second storage capacitor plate CE2. The interlayer insulating layer 115 may include $SiO_2$, $SiN_x$, SiON, $Al_2O_3$, $TiO_2$, $Ta_2O_5$, $HfO_2$ or $ZnO_2$.

The data line DL, the driving voltage line PL, and the connecting metal 1175 may be on the interlayer insulating layer 115. The data line DL, the driving voltage line PL, and the connecting metal 1175 may include a conductive material including Mo, Al, Cu, Ti, or the like, and may be formed as a single layer or multiple layers including one or more of the above-described materials. For example, the data line DL, the driving voltage line PL, and the connecting metal 1175 may be formed of a multilayer structure of Ti/Al/Ti.

The second storage capacitor plate CE2 of the storage capacitor Cst may be connected to the driving voltage line PL through the contact hole CNT defined in the interlayer insulating layer 115. This may mean that the electrode voltage line HL is connected to the driving voltage line PL through the contact hole CNT. Therefore, the electrode voltage line HL may have the same voltage level (constant voltage) as that of the driving voltage line PL.

The connecting metal 1175 is connected to a semiconductor layer A6 of the emission control TFT T6 through the contact hole 1153, which penetrates the interlayer insulating layer 115, the second gate insulating layer 113, and the first gate insulating layer 112. The emission control TFT T6 may be electrically connected to the pixel electrode 210 of the organic light-emitting diode OLED through the connecting metal 1175.

A planarization layer 117 is on the data line DL, the driving voltage line PL, and the connecting metal 1175, and the organic light-emitting diode OLED may be on the planarization layer 117.

The planarization layer 117 may have a flat top surface so that a pixel electrode 210 may be formed flat. The planarization layer 117 may include organic materials, and may be formed as a monolayer or as a multilayer. The planarization layer 117 may include a general polymer, such as benzocyclobutene (BCB), polyimide (PI), hexamethyldisiloxane (HMDSO), polymethylmethacrylate (PMMA), and/or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. The planarization layer 117 may include an inorganic material. The planarization layer 117 may include $SiO_2$, $SiN_x$, SiON, $Al_2O_3$, $TiO_2$, $Ta_2O_5$, $HfO_2$, or $ZnO_2$. When the planarization layer 117 is formed of an inorganic material, chemical planarization polishing may be performed in some cases. Meanwhile, the planarization layer 117 may include both an organic material and an inorganic material.

The pixel electrode 210 may be a (semi-) transparent electrode or a reflective electrode. In some embodiments, the pixel electrode 210 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and may include a transparent or semi-transparent electrode layer formed above the reflective film. The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). In some embodiments, the pixel electrode 210 may be provided in a structure stacked with ITO/Ag/ITO.

A pixel-defining layer 119 may be on the planarization layer 117. The pixel-defining layer 119 may have an opening 1190P for exposing a center portion of the pixel electrode 210 to define a light-emitting region of a pixel. Furthermore, the pixel-defining layer 119 may reduce or prevent generation of an arc on edges of the pixel electrode 210 by increasing a distance between the edges of the pixel electrode 210 and an opposite electrode 230 on the pixel electrode 210. The pixel-defining layer 119 may include an organic insulating material, such as PI, polyamide, acrylic resin, BCB, HMDSO, and phenolic resin, and may be formed by spin coating.

An intermediate layer 220 of the organic light-emitting diode OLED may include an organic emission layer. The organic emission layer may include an organic material including a fluorescent or phosphorescent material that emits red, green, blue, or white light. The organic emission layer may include a low-molecular weight organic material or a high-molecular weight organic material. A functional layer, such as a hole transport layer (HTL), a hole injection layer (HIL), an electron transport layer (ETL), or an electron injection layer (EIL), may selectively be further arranged over and below the organic emission layer, respectively. The intermediate layer 220 may be arranged corresponding to each of a plurality of pixel electrodes 210. However, the disclosure is not limited thereto. The intermediate layer 220 may include a layer that is integral with the plurality of pixel electrodes 210, and various modifications may be made.

The opposite electrode 230 may be a transparent electrode or a reflective electrode. In some embodiments, the opposite electrode 230 may be a transparent electrode or semi-transparent electrode, and may include a metal thin-film, which has a small work function, including Li, Ca, lithium fluoride (LiF)/Ca, LiF/Al, Al, Ag, Mg, or a compound thereof. Furthermore, a transparent conductive oxide (TCO) layer including, for example, ITO, IZO, ZnO, or $In_2O_3$ may further be arranged on the metal thin-film. The opposite electrode 230 may be arranged over the display area DA and the peripheral area PA, and may be on the intermediate layer 220 and the pixel-defining layer 119. The opposite electrode 230 may be formed integrally with a plurality of organic light-emitting diodes OLED to correspond to the plurality of pixel electrodes 210.

When the pixel electrode 210 is provided as a reflective electrode, and the opposite electrode 230 is provided as a transparent electrode, light emitted from the intermediate layer 220 is emitted toward the opposite electrode 230, and the display apparatus may be a top-emission type. When the pixel electrode 210 is provided as a transparent or a semi-transparent electrode, and the opposite electrode 230 is provided as a reflective electrode, light emitted from the intermediate layer 220 is emitted toward the substrate 100, and the display apparatus may be a bottom-emission type. However, the present disclosure is not limited thereto. Furthermore, a type of a display apparatus according to an embodiment may be a double-sided emission type for emitting light toward the front and rear sides of the display apparatus.

In the present embodiment, for example, when the pixel circuit described with reference to FIGS. 5 and 6 is applied to the sub-pixel Pa in the sensor area SA, the first and second electrode layers BSM1 and BSM2 described in FIG. 2 may be between the substrate 100 and the semiconductor layers A1 and A6.

Figure 7:
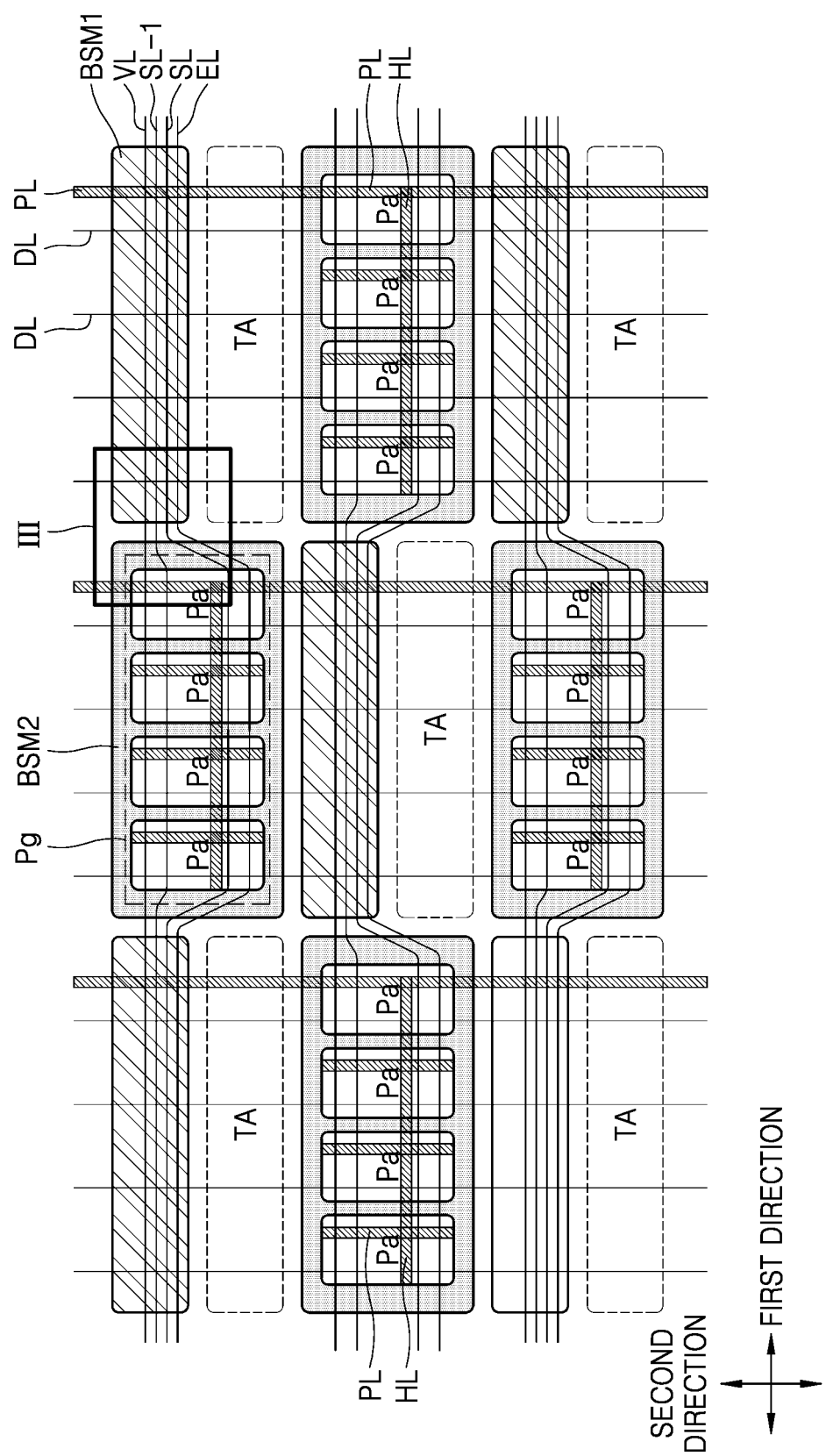
FIG. 7 is a plan view of some of sub-pixels, lines, and transmission portions arranged in a sensor area of a display panel according to an embodiment.
Figure 8:
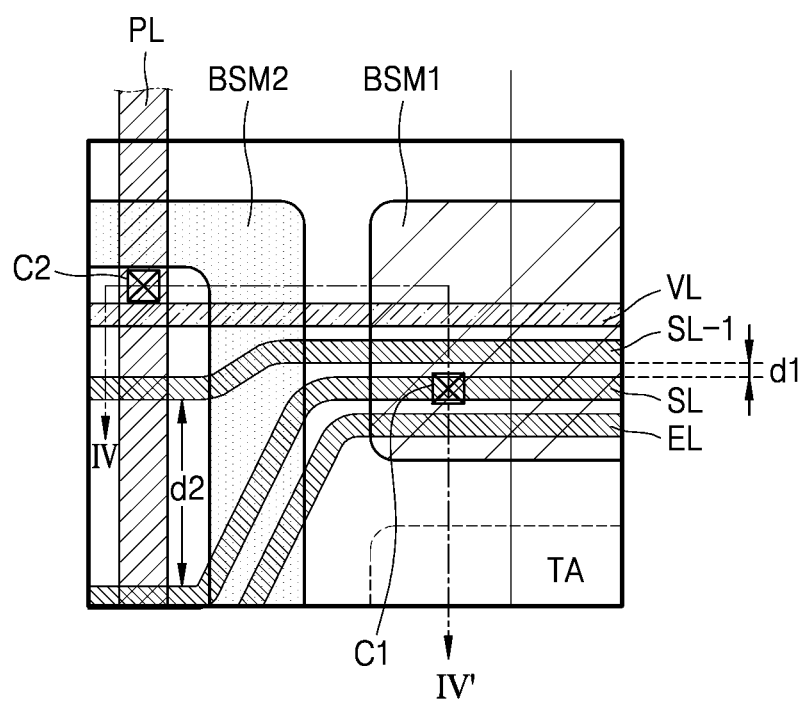
FIG. 8 is an enlarged view of region III in FIG. 7.
Figure 9:
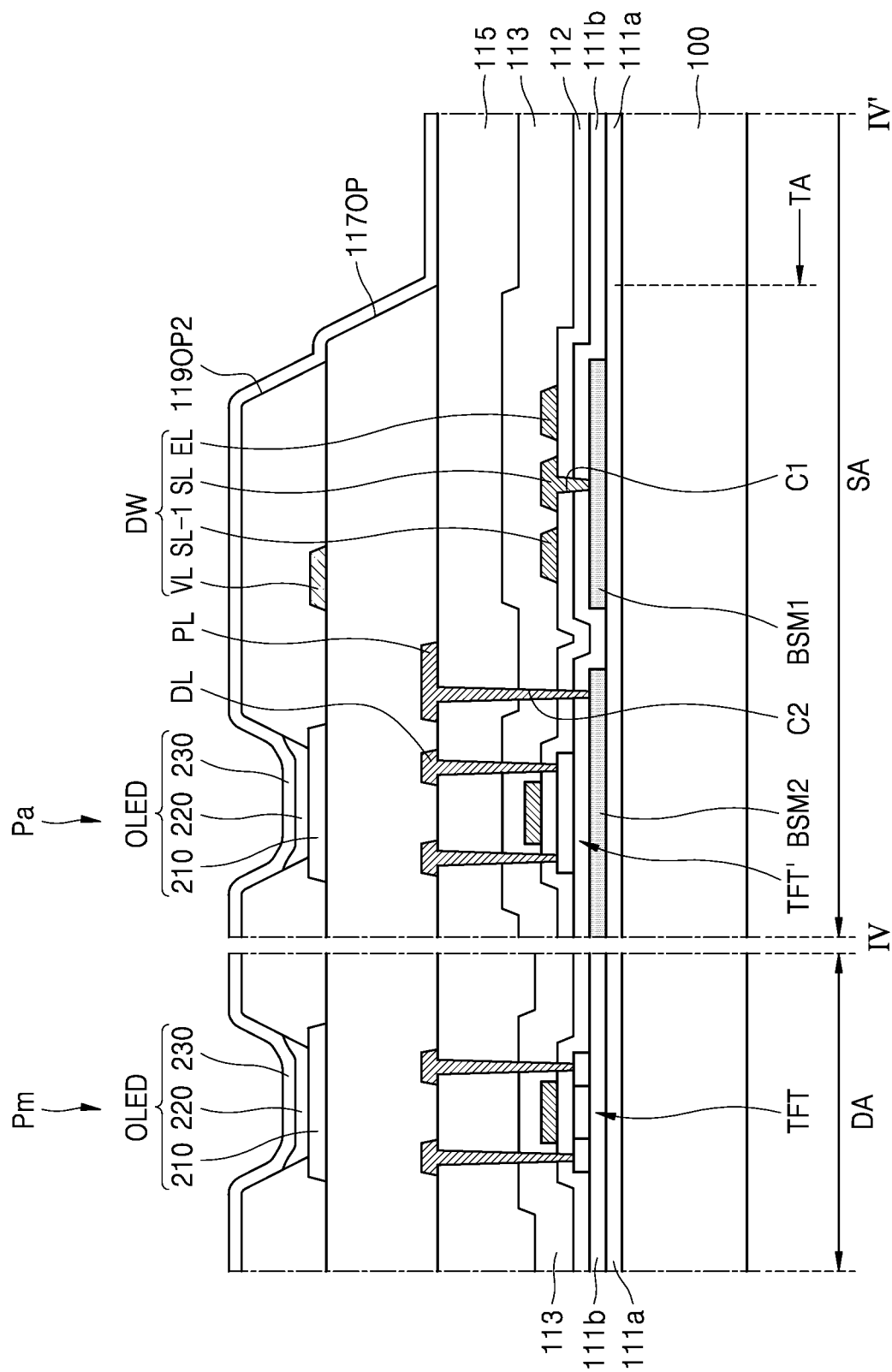
FIG. 9 is a cross-sectional view taken along the line IV-IV' of FIG. 8.

FIG. 7 is a plan view schematically showing some of the sub-pixels Pa arranged in the sensor area SA, the lines DL, PL, HL, VL, SL−1, SL, and EL, and transmission portions TA, and FIG. 8 is an enlarged view of region III in FIG. 7. FIG. 9 is a cross-sectional view taken along the line IV-IV' of FIG. 8. In FIG. 9, the same reference numerals in FIG. 6 denote the same elements, and a repeated duplicate description will be omitted for simplicity.

Referring to FIGS. 7 and 8, the sensor area SA includes the sub-pixels Pa and the transmission portions TA. The sub-pixels Pa may be continuously arranged to form one pixel group Pg. The pixel group Pg may include at least one sub-pixel Pa. In FIG. 7, one pixel group Pg includes four sub-pixels Pa arranged in a row. However, the disclosure is not limited thereto. The number and arrangement of sub-pixels Pa included in one pixel group Pg may vary. For example, one pixel group Pg may include eight sub-pixels Pa arranged in two rows.

The transmission portion TA is a region where display elements are not located, and where light transmittance is high, and may be provided in plural in the sensor area SA. The transmission portion TA may be alternately arranged with the pixel group Pg in the first direction and/or the second direction. Alternatively, the transmission portions TA may be arranged to surround the pixel group Pg. Alternatively, the sub-pixels Pa may be arranged to surround the transmission portion TA.

The sensor area SA is connected to the sub-pixels Pa, and includes the lines VL, SL−1, SL, and EL extending in the first direction and the lines DL and PL extending in the second direction crossing the first direction.

The lines DL and PL extending in the second direction include the data line DL and the driving voltage line PL. When the lines DL and PL extending in the second direction are referred to as second lines, at least one of the second lines is arranged to pass through the transmission portion TA. In some embodiments, the data line DL and/or the driving voltage line PL may be arranged to pass through the transmission portion TA. However, the disclosure is not limited thereto. At least one of the data line DL and the driving voltage line PL may be arranged to bypass the transmission portion TA.

Some of the driving voltage lines PL may be located to pass through the transmission portion TA, and others of the driving voltage lines PL may be formed to be disconnected with the transmission portion TA therebetween. In this case, because the driving voltage line PL is connected to the electrode voltage line HL extending in the first direction, the driving voltage ELVDD may be transmitted to the disconnected driving voltage line PL through the electrode voltage line HL. Because some of the driving voltage lines PL are disconnected with the transmission portion TA therebetween, light transmittance of the transmission portion TA may be improved.

When the lines VL, SL−1, SL, and EL extending in the first direction from among lines connecting the sub-pixels Pa are referred to as first lines, the first lines are arranged to bypass the transmission portion TA. This may be for securing the light transmittance of the transmission portion TA. The first lines may be, for example, the initialization voltage line VL, the previous scan line SL−1, the scan line SL, and the emission control line EL described with reference to FIGS. 4B and 5.

As the first lines are arranged to bypass the transmission portion TA, the first lines may be arranged densely at one side of the transmission portion TA. That is, an interval d1 between adjacent first lines arranged adjacent the transmission portion TA may be less than an interval d2 between first lines passing through the portion corresponding to the sub-pixel Pa (e.g., d1<d2).

Accordingly, a slit having the short interval d1 may be formed between the first lines that bypass the transmission portion TA. When light passes through this slit, light diffraction may occur, so that the component 20 thereunder may not operate normally. Further, the light diffraction may distort an image realized by the sub-pixels Pa.

The present embodiment introduces, to reduce or prevent this phenomenon, the first electrode layer BSM1 which is superimposed below (e.g., in a thickness direction of the display panel) the first lines that bypass around the transmission portion TA. In the plan view, the first electrode layer BSM1 may be between the transmission portion TA and the sub-pixel Pa.

In an embodiment, the first electrode layer BSM1 is provided in an island shape so that the first electrode layer BSM1 may correspond to a plurality of first lines. That is, the first electrode layer BSM1 may overlap the plurality of first lines VL, SL−1, SL, and EL. As a result, it is possible to reduce or prevent external light from passing through the interval between the first lines, thereby reducing the light diffraction.

In an embodiment, the first electrode layer BSM1 may be connected to one of the first lines VL, SL−1, SL, and EL through a contact hole. The first electrode layer BSM1 is provided with voltages or signals of the first lines so that the probability of occurrence of electrostatic discharge may be remarkably reduced. In some embodiments, the first electrode layer BSM1 may be connected to the scan line SL through a first contact hole C1. Accordingly, the first electrode layer BSM1 may serve as a portion of the scan line SL, thereby reducing a resistance value of a line for transmitting a scan signal. That is, as the first electrode layer BSM1 is connected to the scan line SL, RC delay may be improved.

When the first electrode layer BSM1 is in contact with a line for providing a constant voltage, damage to electrostatic discharge may be reduced, but parasitic capacitance may be increased. Therefore, the first electrode layer BSM1 may be more preferably connected to the scan line SL.

In an embodiment, the second electrode layer BSM2 may be below the sub-pixel Pa. The second electrode layer BSM2 prevents external light from reaching the sub-thin-film transistor TFT' included in the sub-pixel Pa so that characteristics of the sub-thin-film transistor TFT' may be stabilized. In addition, the second electrode layer BSM2 may be introduced to reduce or prevent light diffraction by slits formed in the sub-pixel Pa.

In an embodiment, the second electrode layer BSM2 is provided in an island shape so that the second electrode layer BSM2 may correspond to the plurality of sub-pixels Pa. For example, the second electrode layer BSM2 may overlap the entire pixel group Pg.

In an embodiment, the first electrode layer BSM1 and the second electrode layer BSM2 are spaced apart from each other, and may respectively receive different voltages or signals.

For example, the second electrode layer BSM2 may be connected to the driving voltage line PL through a second contact hole C2. The second electrode layer BSM2 receives the driving voltage ELVDD, which is a constant voltage, so that the characteristics of the sub-thin-film transistor TFT' included in the sub-pixel Pa may not be damaged. That is, because the second electrode layer BSM2 is formed to overlap the sub-thin-film transistors TFT', when the second electrode layer BSM2 is connected to lines for providing variable signals, the sub-thin-film transistors TFT' may be influenced by the signals. Therefore, it may be more preferable that the second electrode layer BSM2 is connected to the driving voltage line PL that provides a constant voltage.

In addition, because the second electrode layer BSM2 is connected to the driving voltage line PL without being floated, the probability of occurrence of electrostatic discharge may be reduced.

Referring to FIG. 9, the main pixel Pm is in the display area DA, and the sub-pixel Pa, the transmission portion TA, and a bypass line portion DW bypassing the transmission portion TA are arranged in the sensor area SA.

The main pixel Pm may include the main thin-film transistor TFT and the organic light-emitting diode OLED. The sub-pixel Pa may include the sub-thin-film transistor TFT' and the organic light-emitting diode OLED. The main thin-film transistor TFT and the sub-thin-film transistor TFT' shown in FIG. 9 may correspond to any one of the TFTs T1 to T7 described with reference to FIG. 4A or 4B.

The second electrode layer BSM2 may be below the sub-pixel Pa in the sensor area SA. The second electrode layer BSM2 may be between the first buffer layer 111a and the second buffer layer 111b. The second electrode BSM2 may include a conductive material including Mo, Al, Cu, or Ti and may be formed as a single layer or as multiple layers.

The second electrode layer BSM2 may be connected by the driving voltage line PL through the second contact hole C2. The driving voltage line PL may be on the interlayer insulating layer 115 and the second contact hole C2 may be provided to penetrate the interlayer insulating layer 115, the second gate insulating layer 113, the first gate insulating layer 112, and the second buffer layer 111b.

The first electrode layer BSM1 may be below the bypass line portion DW in the sensor area SA. The first electrode layer BSM1 may be between the first buffer layer 111a and the second buffer layer 111b. The first electrode BSM1 may include a conductive material including Mo, Al, Cu, or Ti, and may be formed as a single layer or as multiple layers. The bypass line portion DW may include the initialization voltage line VL, the previous scan line SL−1, the scan line SL, and the emission control line EL. In the drawings, the initialization voltage line VL is located on the planarization layer 117, which is the same layer on which the pixel electrode 210 is located, but the present disclosure is not limited thereto. The initialization voltage line VL may be on the first gate insulating layer 112 or the second gate insulating layer 113, and various modifications are possible.

The first electrode layer BSM1 may be located so as to cover an interval between lines included in the bypass line portion DW. The first electrode layer BSM1 may be located so as to correspond to a plurality of bypass line portions DW and to an interval therebetween. That is, the plurality of bypass line portions DW may correspond to the first electrode layer BSM1.

The first electrode layer BSM1 may be connected to the scan line SL through a first contact hole C1. The scan line SL may be on the first gate insulating layer 112, and the first contact hole C1 may be provided to penetrate the first gate insulating layer 112 and the second buffer layer 111b.

The sensor area SA has the transmission portion TA. The planarization layer 117 may have a first transmission opening 117OP, and the pixel-defining layer 119 may have a second transmission opening 119OP2 so as to correspond to the transmission portion TA.

Therefore, the first buffer layer 111a, the second buffer layer 111b, the first gate insulating layer 112, the second gate insulating layer 113, the interlayer insulating layer 115, and the opposite electrode 230 may be stacked on the transmission portion TA. Meanwhile, an organic layer formed as a front surface of the substrate 100 in the intermediate layer 220, for example, a hole transport layer, a hole injection layer, an electron transport layer, an electron injection layer, etc., may further be located between the interlayer insulating layer 115 and the opposite electrode 230 in the transmission portion TA. Furthermore, the thin film encapsulation layer 300 or a sealing substrate described with reference to FIG. 2 may be on the opposite electrode 230.

In some embodiments, the opposite electrode 230 may be removed to correspond to the transmission portion TA. In another embodiment, an inorganic insulating layer, that is, the first buffer layer 111a, the second buffer layer 111b, the first gate insulating layer 112, the second gate insulating layer 113, and the interlayer insulating layer 115, may be all removed to correspond to the transmission portion TA. In this case, the removal of the inorganic insulating layer may be performed by an identical etching process when forming the contact holes C1 and C2.

Figure 10:
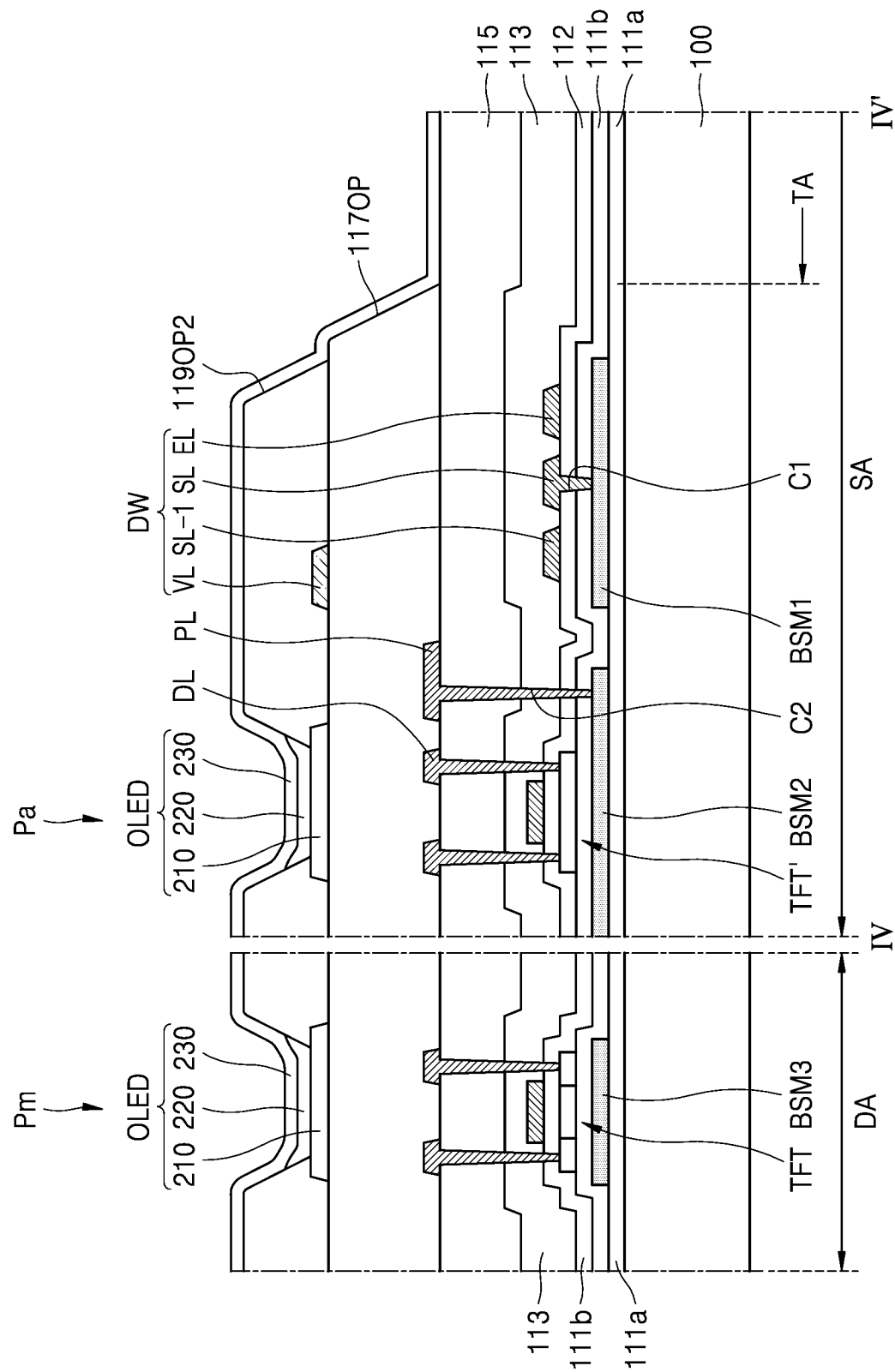
FIG. 10 is a cross-sectional view of a display panel according to another embodiment.

In FIG. 9, an electrode layer is not below the main thin-film transistor TFT in the display area DA, but the disclosure is not limited thereto. As shown in FIG. 10, a third electrode layer BSM3 may be under the main thin-film transistor TFT. The third electrode layer BSM3 may be formed of the same material as, and on the same layer as, the first electrode layer BSM1 and the second electrode layer BSM2.

The third electrode layer BSM3 might not be located to correspond to the entire main pixel Pm, but instead may be located to correspond to a lower portion of a given TFT. For example, the third electrode layer BSM3 may be located to correspond to the driving TFT T1, the compensation TFT T3, or the first initialization TFT T4 of the TFTs described with reference to FIG. 4B. In some embodiments, the third electrode layer BSM3 that is located to correspond to one TFT may be connected to a gate electrode of the TFT, and may serve as one of double gate electrodes. However, the disclosure is not limited thereto. In another embodiment, the third electrode layer BSM3 may be connected to a line to which a constant voltage is applied, for example, the driving voltage line PL. In another embodiment, the third electrode layer BSM3 may correspond to one main pixel Pm or to a plurality of main pixels Pm.

The third electrode layer BSM3 may be introduced to stabilize characteristics of a TFT included in the main pixel Pm.

Figure 11:
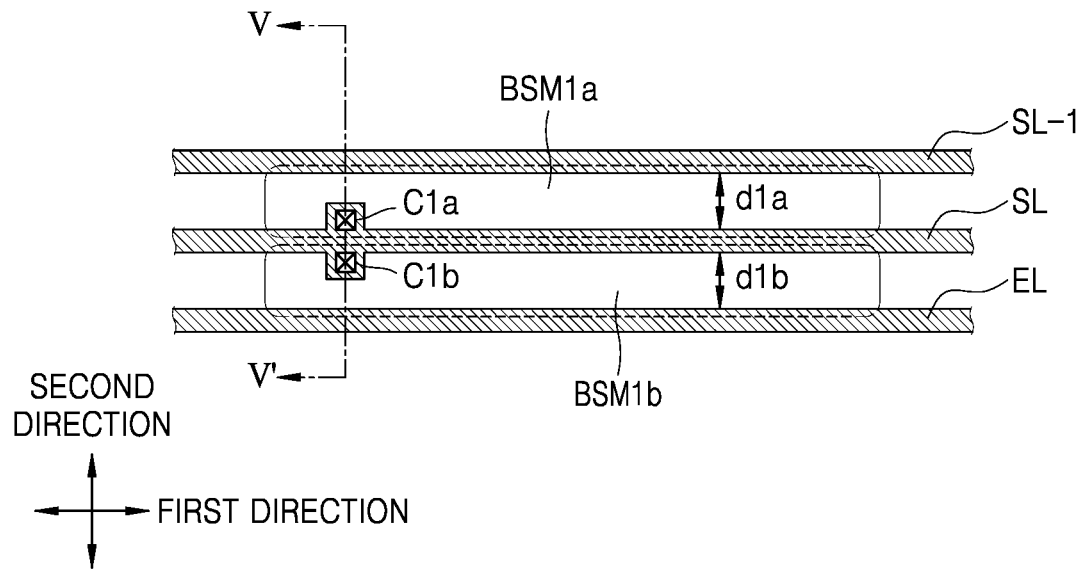
FIG. 11 is a plan view of a display panel according to another embodiment.
Figure 12:
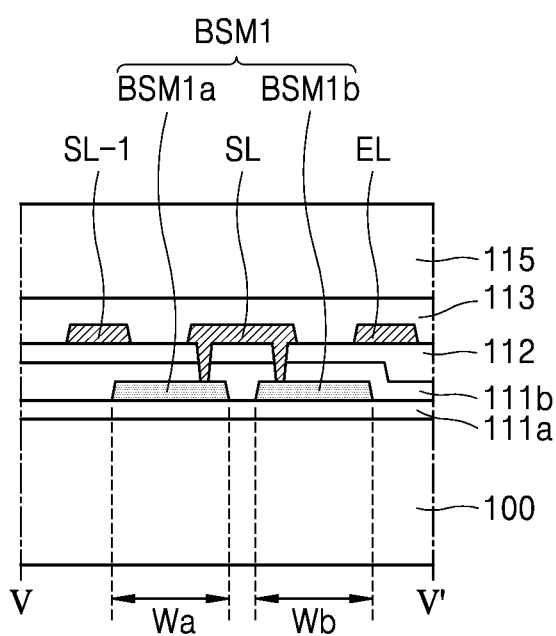
FIG. 12 is a cross-sectional view taken along the line V-V of FIG. 11.

FIG. 11 is a schematic plan view showing arrangement of lines and a first electrode layer that bypass a transmission portion in a sensor area according to another embodiment. FIG. 12 is a schematic cross-sectional view taken along the line V-V of FIG. 11.

Referring to FIGS. 11 and 12, the first electrode layer BSM1 is located so as to overlap a spacing region between a plurality of first lines. The first electrode layer BSM1 may include a first-1 electrode layer BSM1a and a first-2 electrode layer BSM1b, which are spaced apart from each other. The first electrode layer BSM1a may be located so as to cover a spacing region between the previous scan line SL−1 and the scan line SL. In some embodiments, spacing distances d1a and d1b in a second direction between respective ones of the first lines may be less than widths Wa and Wb in the second direction of the first-1 electrode layer BSM1a and the first-2 electrode layer BSM1b.

The first-2 electrode layer BSM1b may be located to cover a spacing region between the scan line SL and the emission control line EL. Accordingly, it is possible to block light incident on the spacing regions so that light diffraction does not occur.

In addition, the first-1 electrode layer BSM1a may be connected to the scan line SL through a first-1 contact hole C1a. The first-2 electrode layer BSM1b may be connected to the scan line SL through a first-2 contact hole C1b. Accordingly, the first-1 electrode layer BSM1a and the first-2 electrode layer BSM1b serve as a portion of the scan line SL, which may reduce the resistance of lines, and may be advantageous in terms of RC delay.

Figure 13:
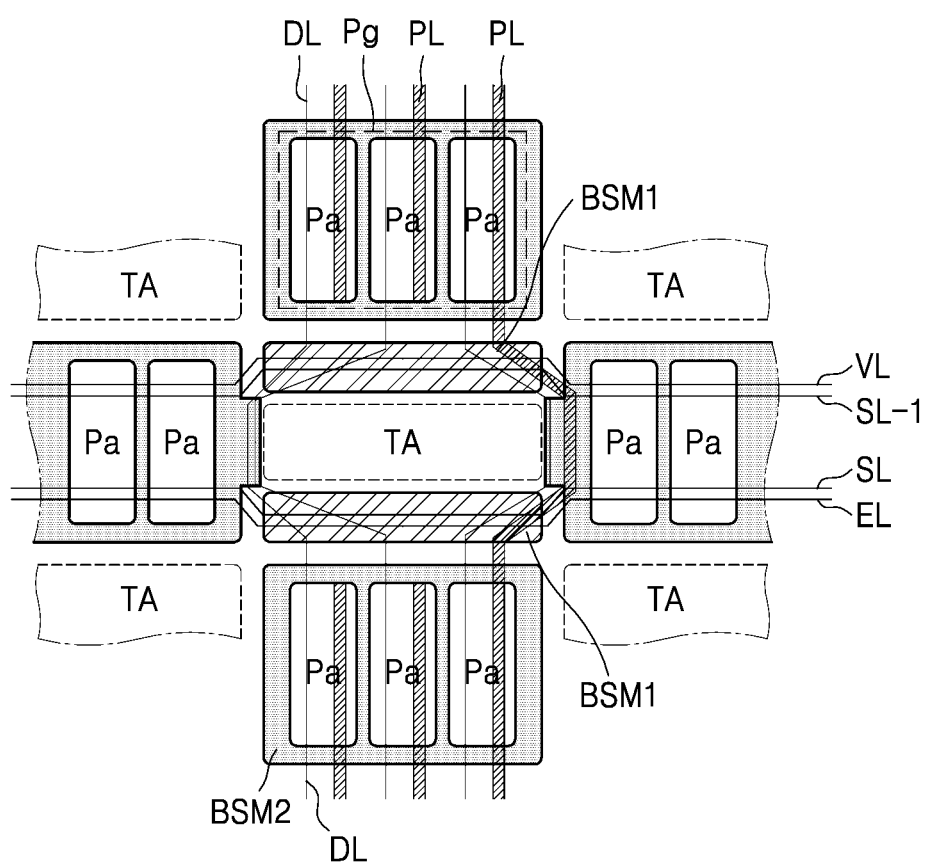
FIG. 13 is a plan view of a display panel according to another embodiment.
Figure 14:
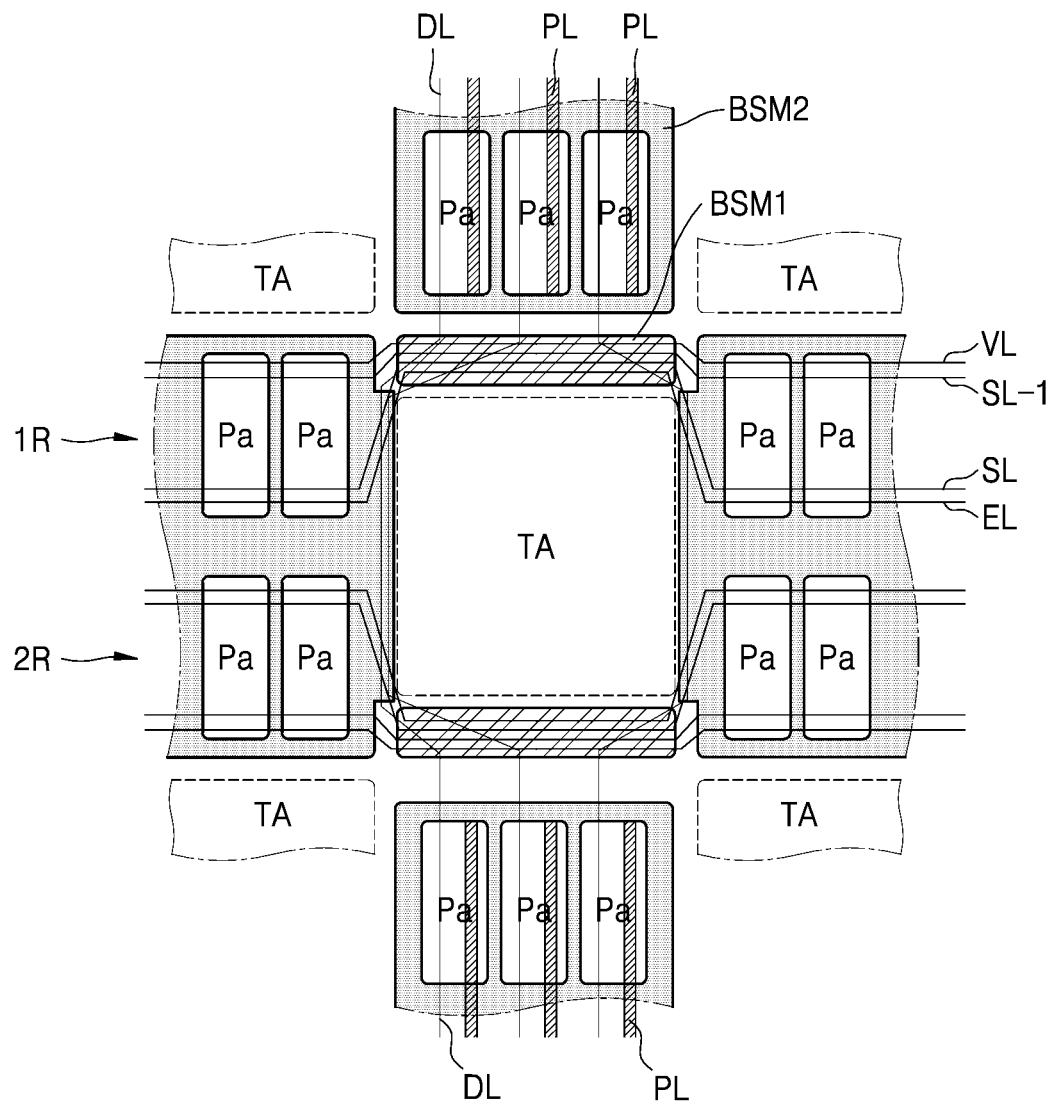
FIG. 14 is a plan view of a display panel according to another embodiment.

FIGS. 13 and 14 are schematic plan views showing a portion of a sensor area according to another embodiment. In FIGS. 13 and 14, the same reference numerals in FIG. 7 denote the same elements, and a repeated duplicate description will be omitted.

Referring to FIG. 13, the plurality of sub-pixels Pa surrounding the transmission portion TA are arranged in the sensor area SA, and lines connecting the sub-pixels Pa separated by the transmission portion TA may be arranged to bypass around the transmission portion TA.

In FIG. 7, lines extending in the first direction bypass only an upper side of the transmission portion TA, but the disclosure is not limited thereto. As shown in FIG. 13, the first lines VL, SL−1, SL, and EL extending in the first direction may be extended to bypass the upper side and a lower side of the transmission portion TA, respectively. Accordingly, the first electrode layer BSM1 may be located with the transmission portion TA therebetween. The first electrode layer BSM1 may be connected to the scan line SL through a contact hole.

In FIG. 7, the data line DL and/or the driving voltage line PL extending in the second direction are arranged to pass through the transmission portion TA, but the disclosure is not limited thereto. As shown in FIG. 13, the data line DL and the driving voltage line PL may be arranged to bypass by the left and/or right side of the transmission portion TA. In this case, the bypassing data line DL and/or the driving voltage line PL may be arranged to overlap the second electrode layer BSM2. The second electrode layer BSM2 may be connected to the driving voltage line PL through a contact hole. The second electrode layer BSM2 may overlap the entire pixel group Pg including the plurality of sub-pixels Pa. In the present embodiment, the pixel group Pg may be composed of three sub-pixels Pa arranged in parallel in the first direction.

Referring to FIG. 14, the pixel group Pg may be arranged in two rows. First lines connecting the sub-pixels Pa arranged in a first column 1R may bypass the upper side of the transmission portion TA, and first lines connecting the sub-pixels Pa arranged in a second column 2R may bypass the lower side of the transmission portion TA.

The first electrode layer BSM1 may be located with the transmission portion TA therebetween. The first electrode layer BSM1 is located to correspond to the first lines that bypass the transmission portion TA, and may block light that may be incident on the first lines. The first electrode layer BSM1 may be connected to the scan line SL.

The second electrode layer BSM2 may be located to overlap the plurality of data lines DL that bypass the pixel group Pg and the transmission portion TA. As the second electrode layer BSM2 overlaps the bypassing data lines DL, the second electrode layer BSM2 may include a region protruding in a direction of the transmission portion TA. The second electrode layer BSM2 may be connected to the driving voltage line PL.

Figure 15:
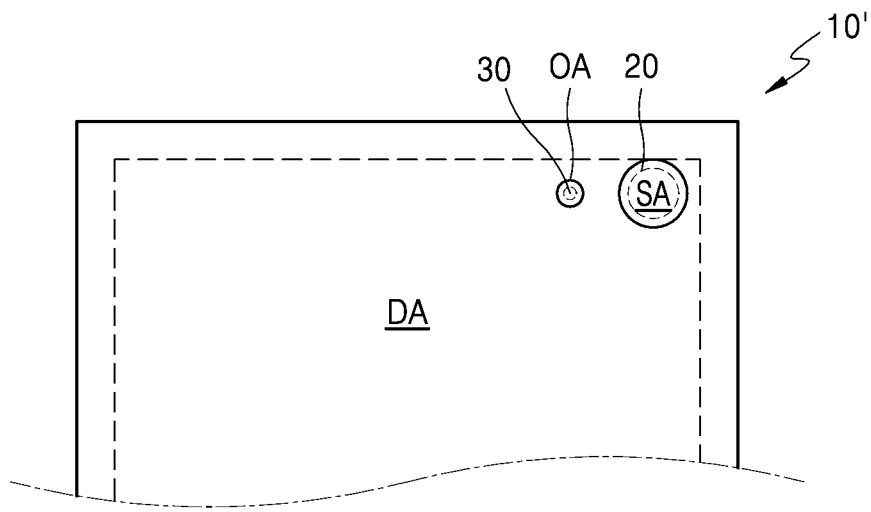
FIG. 15 is a plan view of a display panel according to another embodiment.
Figure 16:
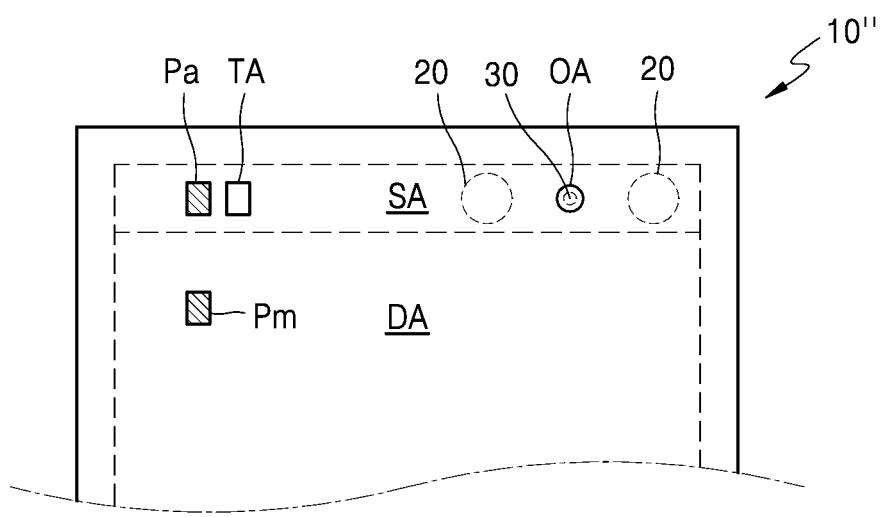
FIG. 16 is a plan view of a display panel according to another embodiment.

FIGS. 15 and 16 are plan views showing a portion of a display panel according to another embodiment.

Referring to FIG. 15, a display panel 10' may further include an opening area OA.

A component 30 may be under the opening area OA. The opening area OA may be understood as a transmission area in which light and/or sound that is output from the component 30 to the outside, or that travels from the outside toward the component 30, may be transmitted. In an embodiment, when light is transmitted through the opening area OA, light transmittance may be about 50% or more, about 70% or more, about 75% or more, about 80% or more, about 85% or more, or about 90% or more. The opening area OA may be an area in which a display element is not located, and cannot provide an image. In the present embodiment, the opening area OA is inside the display area DA, and main pixels may be arranged so as to surround the opening area OA.

The component 20 may also be under the sensor area SA. In addition, the sensor area SA may be provided with sub-pixels to provide a certain image.

In some embodiments, light transmittance of the opening area OA may be greater than light transmittance of the sensor area SA. Accordingly, the component 30 (e.g., a camera) having high light transmittance may be in the opening area OA, and a sensor for detecting infrared rays may be in the sensor area SA.

Referring to FIG. 16, the sensor area SA of a display panel 10" includes an area where the component 20 is located, and the display area DA may be located on one side of the sensor area SA. The sensor area SA may be located corresponding to one side of the display area DA, and a plurality of the components 20 may be arranged corresponding to the sensor area SA.

In addition, the sensor area SA has the sub-pixel Pa and the transmission portion TA, and may provide an image with a lower resolution than a resolution of the display area DA.

The opening area OA may be included in the sensor area SA. The opening area OA is an area having higher light transmittance than the sensor area SA, and the light-sensitive component 30 may be in the opening area OA. The opening area OA may be surrounded by the sub-pixel Pa and the transmission portion TA.

According to embodiments, a pixel portion and a transmission portion are arranged in a sensor area corresponding to a component such as a sensor, and an electrode layer arranged to correspond to the pixel portion and the like is provided, so that an environment in which the sensor may operate and an image may be implemented in a region overlapping the component.

Accordingly, a display apparatus having various functions and improved quality may be provided. However, the effects described above are illustrative, and effects according to the embodiments will be described in detail later below.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
a substrate having a display area comprising a main pixel, and a sensor area comprising a sub-pixel and a transmission portion;
a plurality of first lines arranged in the sensor area, extending in a first direction, and bypassing the transmission portion; and
a first electrode layer under the plurality of first lines, between the sub-pixel and the transmission portion in a plan view such that there exists a space between the first electrode layer and the sub-pixel in the plan view, and at least partially overlapping a spacing region between the plurality of first lines.

2. A display apparatus comprising:
a substrate having a display area comprising a main pixel, and a sensor area comprising a sub-pixel and a transmission portion;
a plurality of first lines arranged in the sensor area, extending in a first direction, and bypassing the transmission portion; and
a first electrode layer under the plurality of first lines, between the sub-pixel and the transmission portion, and at least partially overlapping a spacing region between the plurality of first lines,
wherein the plurality of first lines comprise a scan line connected to the sub-pixel, and
wherein the first electrode layer is connected to the scan line through a contact hole.

3. The display apparatus of claim 1, further comprising a second electrode layer between the substrate and a sub-thin-film transistor of the sub-pixel, and corresponding to the sub-pixel.

4. The display apparatus of claim 3, further comprising a driving voltage line extending in a second direction crossing the first direction, and configured to provide a driving voltage to the sub-pixel,
wherein the second electrode layer is connected to the driving voltage line through a contact hole.

5. The display apparatus of claim 3, wherein the first electrode layer and the second electrode layer are spaced apart from each other and have an island shape.

6. The display apparatus of claim 1, wherein the sub-pixel comprises a sub-thin-film transistor comprising a semiconductor layer and a gate electrode,
wherein some of the first lines are above a same layer as the gate electrode, and
wherein the first electrode layer is under a layer in which the semiconductor layer is located.

7. The display apparatus of claim 1, further comprising a third electrode layer overlapping at least one of a plurality of main thin-film transistors in the main pixel,
wherein the third electrode layer is on a same layer as the first electrode layer.

8. The display apparatus of claim 1, further comprising a second line extending in a second direction crossing the first direction, and overlapping the transmission portion.

9. The display apparatus of claim 1, further comprising:
a second line extending in a second direction crossing the first direction, and arranged to bypass the transmission portion; and
a second electrode layer under the second line so as to overlap the second line, and at a same layer as the first electrode layer.

10. The display apparatus of claim 1, wherein a resolution of an image provided by the sensor area is less than a resolution of an image provided by the display area.

11. A display apparatus comprising:
a substrate having a display area comprising a main pixel, and a sensor area having a transmission portion and comprising a sub-pixel;
a plurality of first lines arranged in the sensor area, extending in a first direction, and bypassing the transmission portion;
a plurality of second lines arranged in the sensor area, and extending in a second direction crossing the first direction; and
a first electrode layer under the plurality of first lines, and at least partially overlapping a spacing region between the plurality of first lines,
wherein the first electrode layer is between the sub-pixel and the transmission portion in a plan view such that there exists a space between the first electrode layer and the sub-pixel in the plan view.

12. The display apparatus of claim 11, further comprising a component corresponding to the sensor area on a lower surface of the substrate.

13. The display apparatus of claim 11, wherein some of the plurality of second lines cross the transmission portion.

14. The display apparatus of claim 11, further comprising a second electrode layer on one side of the transmission portion, spaced apart from the first electrode layer, and at a same layer as the first electrode layer,
wherein the plurality of second lines are arranged to bypass along an edge of the transmission portion, and
wherein the second electrode layer overlaps the plurality of second lines.

15. The display apparatus of claim 11, further comprising a pixel group adjacent the transmission portion, and comprising a plurality of sub-pixels; and
a second electrode layer overlapping an entirety of the pixel group.

16. The display apparatus of claim 15, wherein the first electrode layer is connected to a scan line for transmitting a scan signal to the sub-pixels, and wherein the second electrode layer is connected to a driving voltage line for transmitting a driving voltage to the sub-pixels.

17. The display apparatus of claim 15, wherein the first electrode layer and the second electrode layer are spaced apart from each other.

18. The display apparatus of claim 11, further comprising a third electrode layer overlapping a main thin-film transistor, and at a same layer as the first electrode layer,
   wherein the main pixel comprises a main thin-film transistor comprising a main semiconductor layer and a main gate electrode.

19. The display apparatus of claim 18, wherein the third electrode layer is connected to the main gate electrode.

20. The display apparatus of claim 11, further comprising:
   an opening area in the sensor area;
   a first component corresponding to the opening area on a lower surface of the substrate; and
   a second component corresponding to the sensor area on the lower surface of the substrate,
   wherein light transmittance of the opening area is greater than light transmittance of the sensor area, and
   wherein the sensor area comprises a sub-pixel to implement an image.

* * * * *